United States Patent
Wang et al.

(10) Patent No.: US 12,417,970 B2
(45) Date of Patent: Sep. 16, 2025

(54) METHOD FOR FORMING CHIP PACKAGE STRUCTURE

(71) Applicant: Taiwan Semiconductor Manufacturing Company, Ltd., Hsinchu (TW)

(72) Inventors: Chin-Hua Wang, New Taipei (TW); Chia Kuei Hsu, Hsinchu (TW); Shu-Shen Yeh, Taoyuan (TW); Po-Chen Lai, Hsinchu County (TW); Po-Yao Lin, Zhudong Township, Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 777 days.

(21) Appl. No.: 17/370,312

(22) Filed: Jul. 8, 2021

(65) Prior Publication Data

US 2023/0011353 A1 Jan. 12, 2023

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4853* (2013.01); *H01L 21/4857* (2013.01);
(Continued)

(58) Field of Classification Search
CPC ........... H01L 23/49838; H01L 21/4853; H01L 21/4857; H01L 21/486; H01L 23/49816; H01L 23/49822; H01L 23/49833; H01L 24/16; H01L 24/73; H01L 25/0655; H01L 2224/16165; H01L 2224/73204; H01L 2924/3512
See application file for complete search history.

(56) References Cited

U.S. PATENT DOCUMENTS 9,972,581 B1 * 5/2018 Yu .......................... H01L 21/568
2011/0095436 A1 4/2011 Chen et al.
(Continued)

OTHER PUBLICATIONS

Chinese language office action dated Mar. 22, 2022, issued in application No. TW 110136850.

*Primary Examiner* — Benjamin Tzu-Hung Liu
(74) *Attorney, Agent, or Firm* — McClure, Qualey & Rodack, LLP

(57) ABSTRACT

A chip package structure is provided. The chip package structure includes a wiring substrate. The chip package structure includes an interposer substrate over the wiring substrate. The interposer substrate includes a redistribution structure, a dielectric layer, a conductive via, and a plurality of first dummy vias, the dielectric layer is over the redistribution structure, the conductive via and the first dummy vias pass through the dielectric layer, the first dummy vias surround the conductive via, and the first dummy vias are electrically insulated from the wiring substrate. The chip package structure includes a chip structure over the interposer substrate. The chip structure is electrically connected to the conductive via, and the chip structure is electrically insulated from the first dummy vias.

20 Claims, 18 Drawing Sheets

(51) Int. Cl.
   *H01L 23/00*   (2006.01)
   *H01L 25/065*  (2023.01)
(52) U.S. Cl.
   CPC ...... *H01L 21/486* (2013.01); *H01L 23/49816* (2013.01); *H01L 23/49822* (2013.01); *H01L 23/49833* (2013.01); *H01L 24/16* (2013.01); *H01L 24/73* (2013.01); *H01L 25/0655* (2013.01); *H01L 2224/16165* (2013.01); *H01L 2224/73204* (2013.01); *H01L 2924/3512* (2013.01)

(56) References Cited

U.S. PATENT DOCUMENTS

| | | | |
|---|---|---|---|
| 2016/0093572 A1* | 3/2016 | Chen | H01L 23/5389 |
| | | | 438/126 |
| 2017/0271286 A1 | 9/2017 | Kim | |
| 2018/0053732 A1* | 2/2018 | Baek | H01L 23/5389 |
| 2020/0020628 A1* | 1/2020 | Huang | H01L 21/56 |
| 2020/0135642 A1* | 4/2020 | Lee | H01L 24/19 |
| 2021/0066230 A1 | 3/2021 | Huang et al. | |
| 2022/0052009 A1* | 2/2022 | Huang | H01L 21/4853 |
| 2022/0059466 A1* | 2/2022 | Song | H01L 25/0655 |

\* cited by examiner

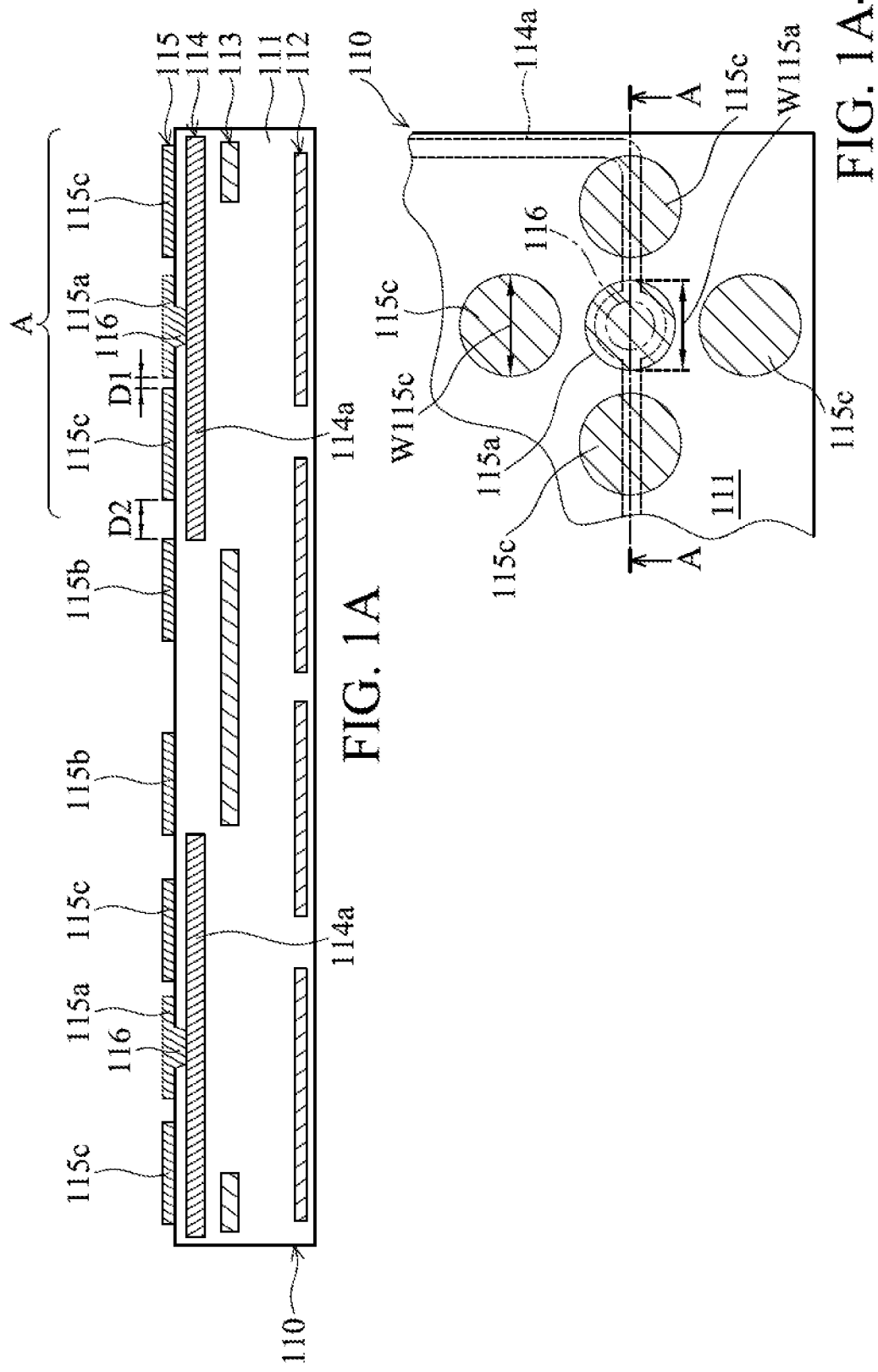

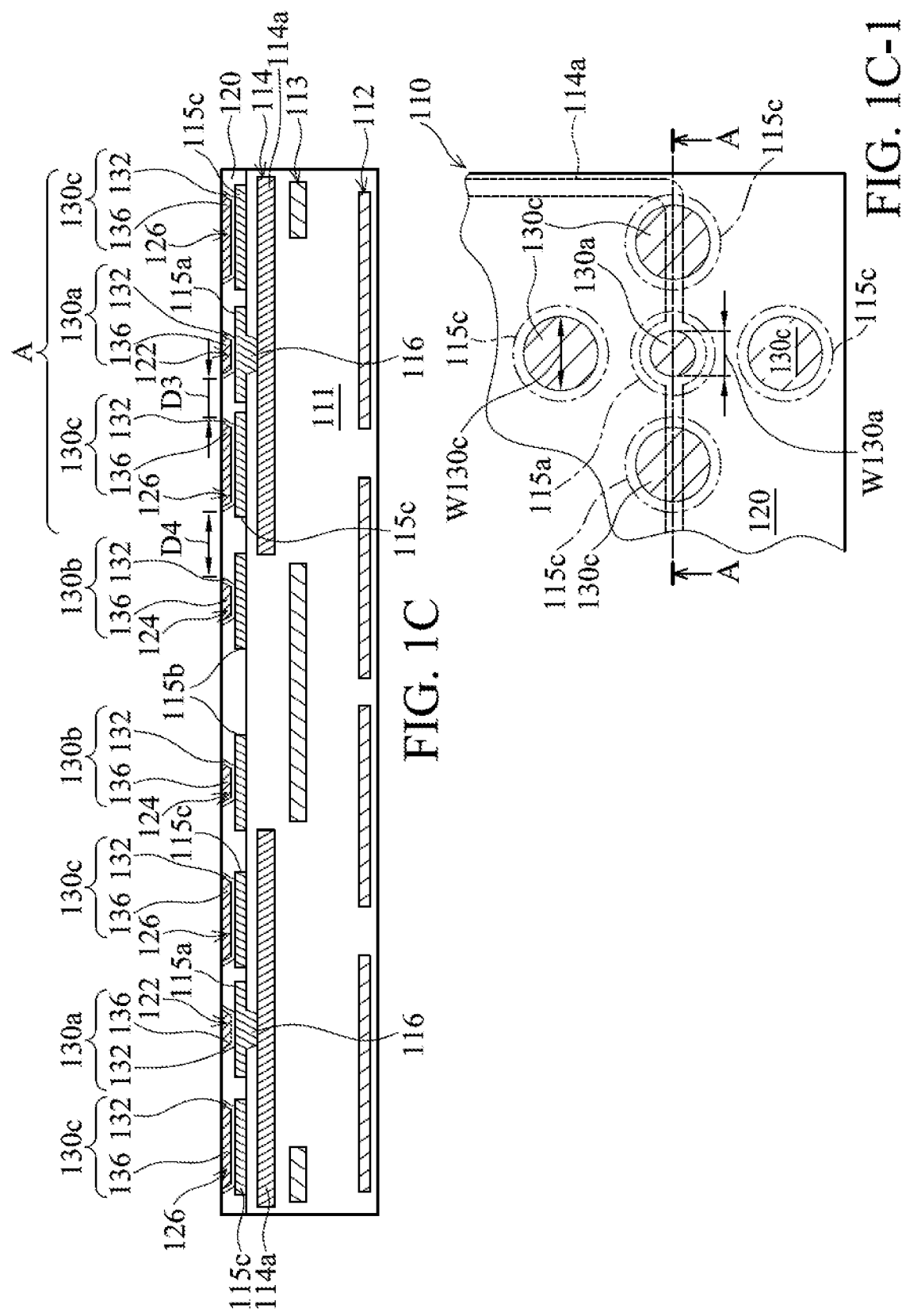

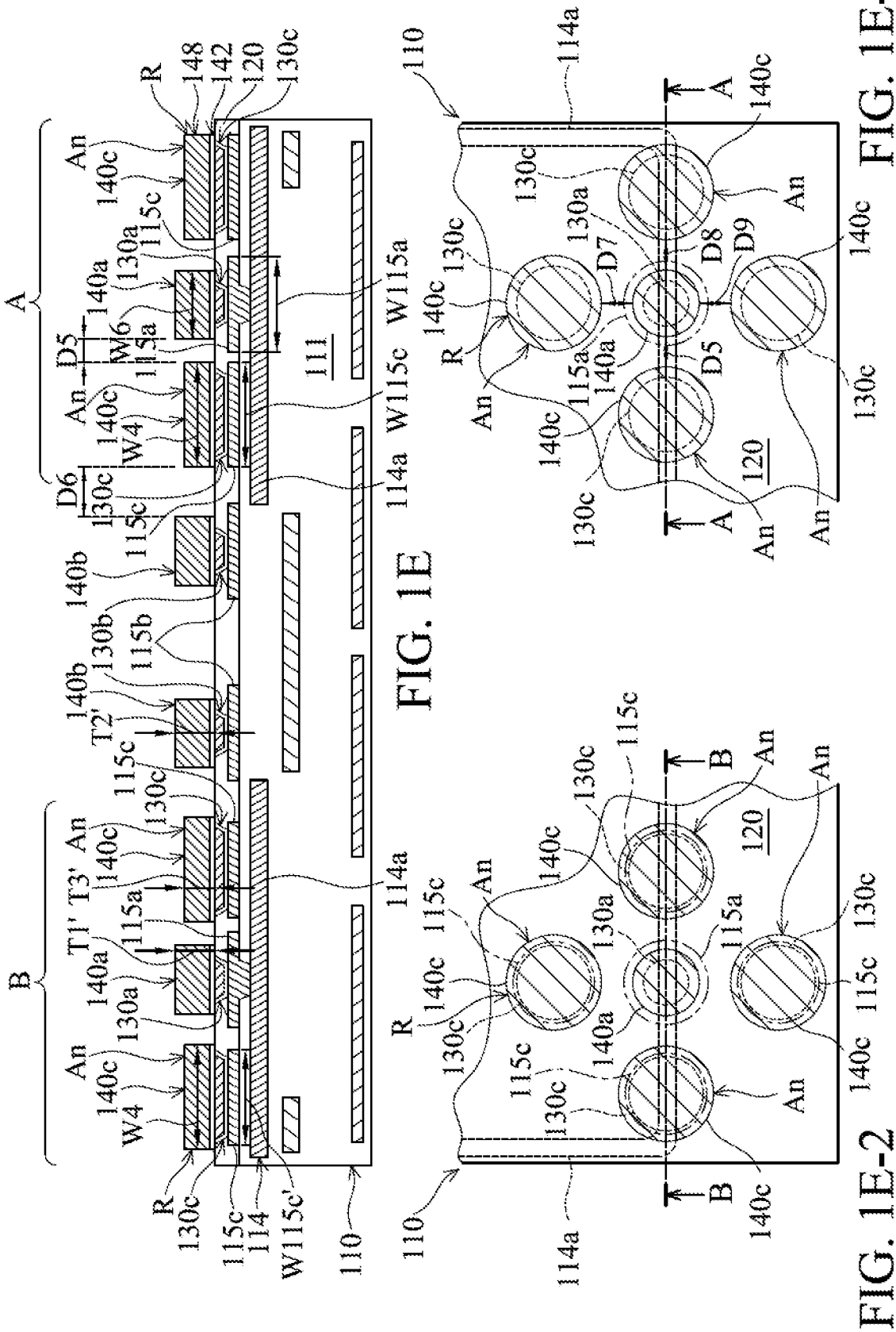

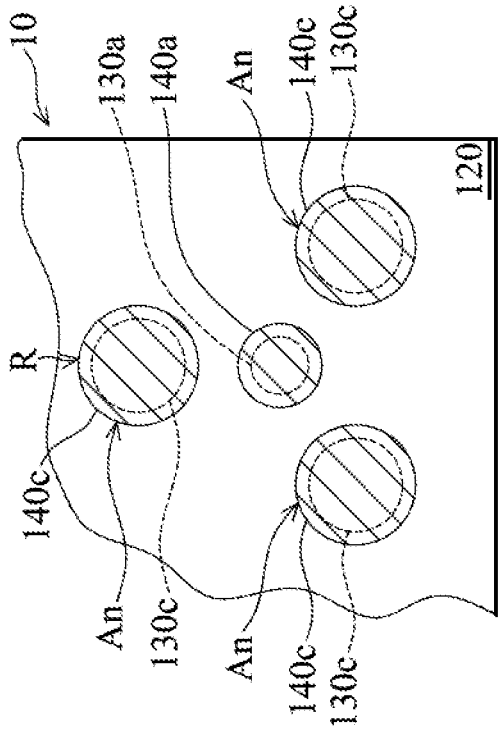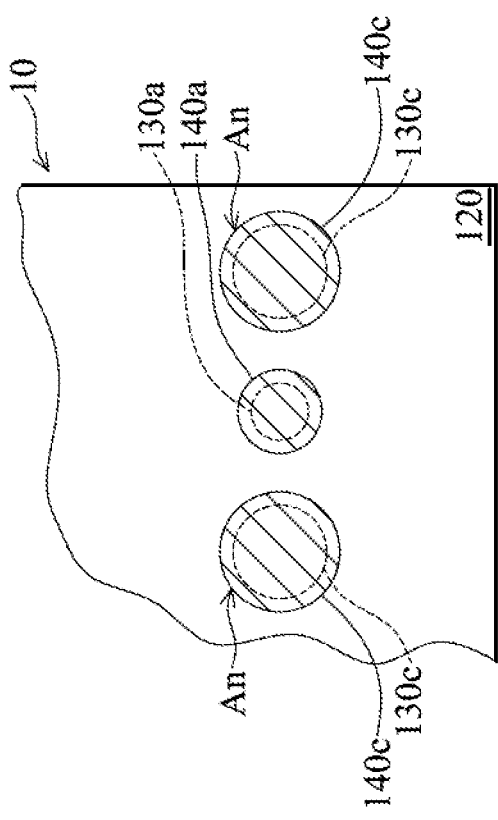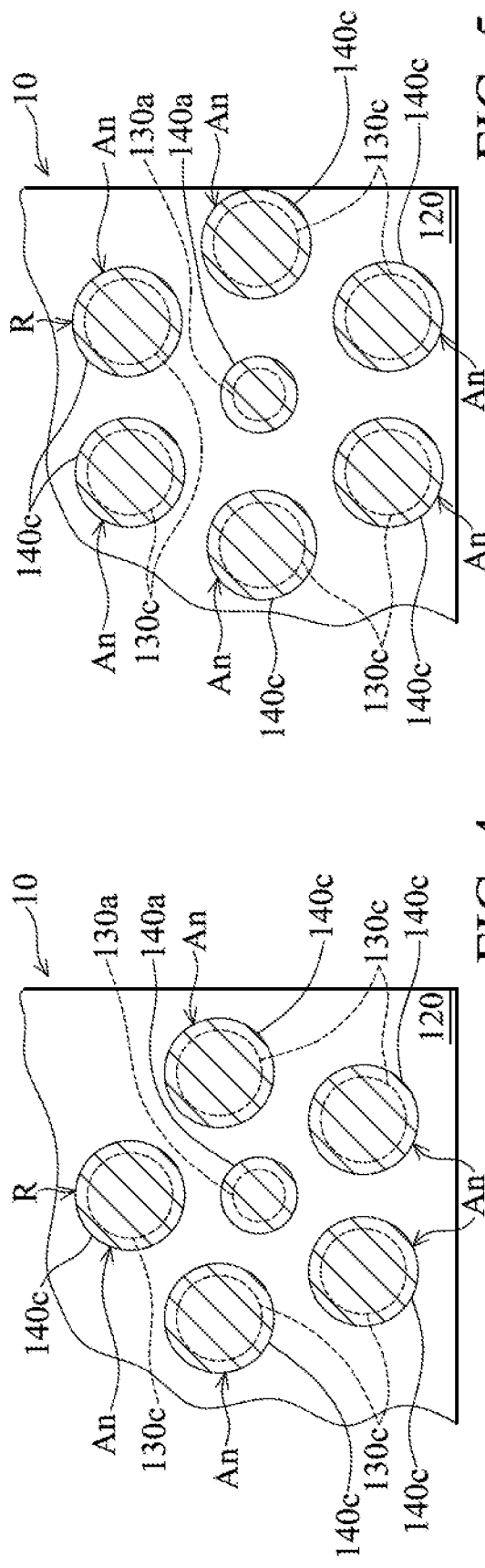

METHOD FOR FORMING CHIP PACKAGE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements.

Dozens or hundreds of integrated circuits are typically manufactured on a single semiconductor wafer. The individual dies are singulated by sawing the integrated circuits along scribe lines. The individual dies are then packaged separately. The semiconductor industry continues to improve the integration density of various electronic components (e.g., transistors, diodes, resistors, capacitors, etc.) by continual reductions in minimum feature size, which allow more components to be integrated into a given area. However, since feature sizes of dies continue to decrease, feature sizes of an interposer substrate for carrying the dies decrease as well. Therefore, it is a challenge to form reliable packages with the dies and the interposer substrate with small feature sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1H are cross-sectional views of various stages of a process for forming a chip package structure, in accordance with some embodiments.

FIG. 1A-1 is a top view of a region of the redistribution structure of FIG. 1A, in accordance with some embodiments.

FIG. 1C-1 is a top view of a region of the redistribution structure of FIG. 1C, in accordance with some embodiments.

FIG. 1E-1 is a top view of a right region of the redistribution structure of FIG. 1E, in accordance with some embodiments.

FIG. 1E-2 is a top view of a left region of the redistribution structure of FIG. 1E, in accordance with some embodiments.

FIG. 1H-1 is a top view of the chip package structure of FIG. 1H, in accordance with some embodiments.

FIG. 1H-2 is a top view of the chip package structure of FIG. 1H, in accordance with some embodiments.

FIG. 1H-3 is a top view of the chip package structure of FIG. 1H, in accordance with some embodiments.

FIG. 2 is a top view of a corner region of the interposer substrate of FIG. 1H, in accordance with some embodiments.

FIG. 3 is a top view of a corner region of the interposer substrate of FIG. 1H, in accordance with some embodiments.

FIG. 4 is a top view of a corner region of the interposer substrate of FIG. 1H, in accordance with some embodiments.

FIG. 5 is a top view of a corner region of the interposer substrate of FIG. 1H, in accordance with some embodiments.

FIG. 10A-1 is a top view of a corner region of the interposer substrate of FIG. 10A, in accordance with some embodiments.

DETAILED DESCRIPTION

Figure 1B:
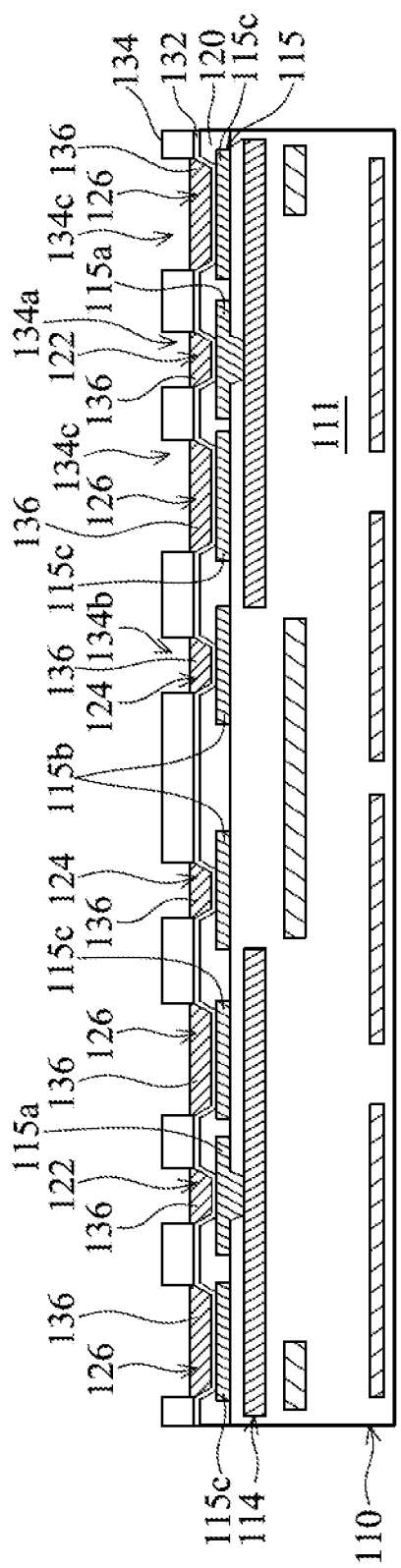

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% or higher, such as 95% or higher, especially 99% or higher, including 100%, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10%, though the present invention is not limited thereto. The term "about" in relation to a numerical value x may mean x±5 or 10%, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

FIGS. 1A-1H are cross-sectional views of various stages of a process for forming a chip package structure, in accordance with some embodiments. FIG. 1A-1 is a top view of a region A of the redistribution structure 110 of FIG. 1A, in accordance with some embodiments. The region A of FIG. 1A shows a cross-sectional view illustrating the redistribution structure 110 along a sectional line A-A in FIG. 1A-1, in accordance with some embodiments.

As shown in FIGS. 1A and 1A-1, a redistribution structure 110 is provided, in accordance with some embodiments. The redistribution structure 110 is used to from an interposer substrate for integrated fan-out packaging or wafer level packaging, in accordance with some embodiments. The redistribution structure 110 includes a dielectric layer 111, redistribution layers 112, 113, 114 and 115, and conductive vias 116, in accordance with some embodiments. The redistribution layers 112, 113, 114 and 115 and the conductive vias 116 are formed in the dielectric layer 111, in accordance with some embodiments.

As shown in FIG. 1A, the conductive vias 116 are electrically connected between the redistribution layers 114 and 115, in accordance with some embodiments. In some embodiments, conductive vias (not show) are electrically connected between the redistribution layers 112, 113, and 114. For the sake of simplicity, FIG. 1A only shows four redistribution layers (i.e., 112, 113, 114 and 115), in accordance with some embodiments. It should be noted that the number of redistribution layers is not limited in the present embodiment. In other words, there may be five or more redistribution layers.

As shown in FIGS. 1A and 1A-1, the redistribution layer 114 includes conductive lines 114a, in accordance with some embodiments. The redistribution layer 115 includes pads 115a and 115b, dummy pads 115c, and conductive lines (not shown), in accordance with some embodiments. The conductive lines are connected to the pads 115b (and 115a), in accordance with some embodiments.

The dummy pads 115c surround the corresponding pad 115a, in accordance with some embodiments. The width W115c of the dummy pad 115c is substantially equal to or greater than the width W115a of the pad 115a, in accordance with some embodiments. In some other embodiments, width W115c is less than the width W115a.

In some embodiments, a dummy pad 115c is between the pads 115a and 115b, and a distance D1 between the pad 115a and the dummy pad 115c is less than a distance D2 between the dummy pad 115c and the pad 115b. In some other embodiments, the distance D1 is substantially equal to or greater than the distance D2.

The distance D1 ranges from about 25 µm to about 75 µm, in accordance with some embodiments. The distance D2 ranges from about 25 µm to about 75 µm, in accordance with some embodiments.

The conductive vias 116 are connected between the pads 115a and the conductive lines 114a, in accordance with some embodiments. In some embodiments, portions of the conductive lines 114a are under the dummy pads 115c. That is, the dummy pads 115c cover or overlap the portions of the conductive lines 114a, in accordance with some embodiments.

The dielectric layer 111 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments.

The dielectric layer 111 is formed using deposition processes (e.g. chemical vapor deposition processes or physical vapor deposition processes), photolithography processes, and etching processes, in accordance with some embodiments. The redistribution layers 112, 113, 114 and 115 and the conductive vias 116 are made of a conductive material, such as metal (e.g. copper, aluminum, or tungsten) or alloys thereof, in accordance with some embodiments.

As shown in FIG. 1B, a dielectric layer 120 is formed over the redistribution structure 110, in accordance with some embodiments. The dielectric layer 120 has openings 122, 124, and 126, in accordance with some embodiments. The openings 122 expose the pads 115a thereunder, in accordance with some embodiments. The openings 124 expose the pads 115b thereunder, in accordance with some embodiments. The openings 126 expose the pads 115c thereunder, in accordance with some embodiments.

The dielectric layer 120 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The dielectric layer 120 is formed using deposition processes (e.g. chemical vapor deposition processes or physical vapor deposition processes), photolithography processes, and etching processes, in accordance with some embodiments.

As shown in FIG. 1B, a seed layer 132 is conformally formed over the dielectric layer 120 and the redistribution layer 115, in accordance with some embodiments. The seed layer 132 is made of a conductive material, such as metal (e.g., copper, aluminum, gold, silver, or tungsten) or alloys thereof, in accordance with some embodiments. The seed layer 132 is formed using a deposition process, such as a physical vapor deposition process or a chemical vapor deposition process, in accordance with some embodiments.

As shown in FIG. 1B, a mask layer 134 is formed over the seed layer 132 over the dielectric layer 120, in accordance with some embodiments. The mask layer 134 has openings 134a, 134b and 134c, in accordance with some embodiments. The openings 134a, 134b and 134c are respectively over portions of the seed layer 132 over the pads 115a and 115b and the dummy pads 115c, in accordance with some embodiments. The mask layer 134 is made of a polymer material, such as a photoresist material, in accordance with some embodiments.

As shown in FIG. 1B, a conductive layer 136 is formed in the openings 122, 124, and 126 and over the seed layer 132, in accordance with some embodiments. The conductive layer 136 is made of a conductive material, such as metal (e.g., copper, aluminum, gold, silver, or tungsten) or alloys thereof, in accordance with some embodiments. The conductive layer 136 is formed using a plating process, such as an electroplating process, in accordance with some embodiments.

As shown in FIG. 1C, the mask layer 134, the seed layer 132 and the conductive layer 136 outside of the openings 122, 124, and 126 are removed, in accordance with some embodiments. The seed layer 132 and the conductive layer 136 remaining in the openings 122 form conductive vias 130a, in accordance with some embodiments.

The seed layer 132 and the conductive layer 136 remaining in the openings 124 form conductive vias 130b, in accordance with some embodiments. The seed layer 132 and the conductive layer 136 remaining in the openings 126 form dummy vias 130c, in accordance with some embodiments.

The conductive vias 130a are over and connected to the pads 115a, in accordance with some embodiments. The conductive vias 130b are over and connected to the pads 115b, in accordance with some embodiments. The dummy vias 130c are over and connected to the dummy pads 115c, in accordance with some embodiments. The conductive vias 130a and 130b and the dummy vias 130c pass through the dielectric layer 120, in accordance with some embodiments.

FIG. 1C-1 is a top view of a region A of the redistribution structure of FIG. 1C, in accordance with some embodiments. For the sake of simplicity, FIG. 1C-1 does not show the seed layer 132. The region A of FIG. 1C shows a cross-sectional view illustrating the redistribution structure 110 along a sectional line A-A in FIG. 1C-1, in accordance with some embodiments.

As shown in FIGS. 1C and 1C-1, the dummy vias 130c surround the corresponding conductive via 130a, in accordance with some embodiments. The width W130c of the dummy via 130c is substantially equal to or greater than the width W130a of the conductive via 130a, in accordance with some embodiments. In some other embodiments, the width W130c is less than the width W130a.

In some embodiments, one of the dummy vias 130c is between the conductive via 130a and 130b, and a distance D3 between the conductive via 130a and the dummy via 130c is less than a distance D4 between the conductive via 130b and the dummy via 130c. In some other embodiments, the distance D3 is substantially equal to or greater than the distance D4. The distance D3 ranges from about 55 μm to about 105 μm, in accordance with some embodiments. The distance D4 ranges from about 55 μm to about 105 μm, in accordance with some embodiments.

Each conductive via 130a is electrically connected to the conductive line 114a thereunder through the pad 115a and the conductive via 116 therebetween, in accordance with some embodiments. In some embodiments, portions of the conductive lines 114a are under the dummy vias 130c. That is, the dummy vias 130c partially overlap the conductive lines 114a thereunder, in accordance with some embodiments.

The dummy pad 115c is between the dummy via 130c and the conductive line 114a, in accordance with some embodiments. The dummy vias 130c are electrically insulated from the redistribution layers 112, 113, and 114 (including the conductive lines 114a), in accordance with some embodiments.

Figure 1D:
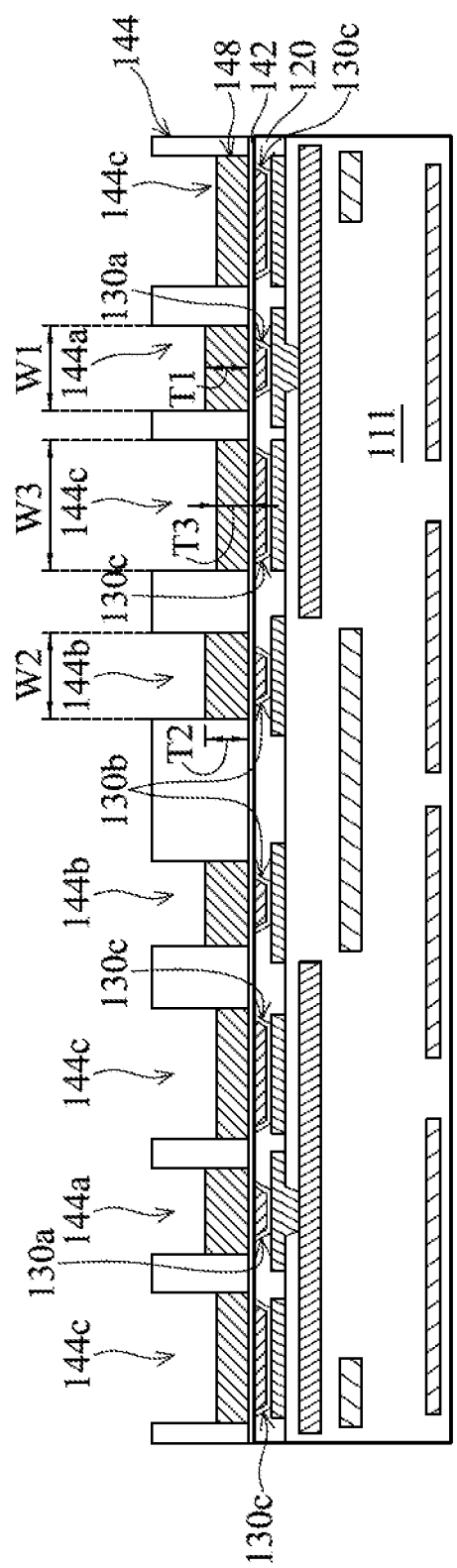

As shown in FIG. 1D, a seed layer 142 is conformally formed over the dielectric layer 120, the conductive vias 130a and 130b, and the dummy vias 130c, in accordance with some embodiments. The seed layer 142 is made of a conductive material, such as metal (e.g., copper, aluminum, gold, silver, or tungsten) or alloys thereof, in accordance with some embodiments. The seed layer 142 is formed using a deposition process, such as a physical vapor deposition process or a chemical vapor deposition process, in accordance with some embodiments.

As shown in FIG. 1D, a mask layer 144 is formed over the seed layer 142 over the dielectric layer 120, in accordance with some embodiments. The mask layer 144 has openings 144a, 144b and 144c, in accordance with some embodiments. The openings 144a, 144b and 144c are respectively over portions of the seed layer 142 over the conductive vias 130a and 130b and the dummy vias 130c, in accordance with some embodiments.

The width W1 of the opening 144a is substantially equal to the width W2 of the opening 144b, in accordance with some embodiments. The width W3 of the opening 144c is substantially equal to or greater than the width W1 or W2, in accordance with some embodiments. In some other embodiments, the width W3 is less than the width W1 or W2. The mask layer 144 is made of a polymer material, such as a photoresist material, in accordance with some embodiments.

As shown in FIG. 1D, a conductive layer 148 is formed in the openings 144a, 144b, and 144c and over the seed layer 142, in accordance with some embodiments. The conductive layer 148 is made of a conductive material, such as metal (e.g., titanium, copper, nickel, or aluminum) or alloys thereof, in accordance with some embodiments. The conductive layer 148 is formed using a plating process, such as an electroplating process, in accordance with some embodiments.

When the widths W1 and W2 of the openings 144a and 144b both are less than the width W3 of the opening 144c, the plating current density applied on the seed layer 142 under the openings 144a and 144b is greater than the plating current density applied on the seed layer 142 under the opening 144c, in accordance with some embodiments. Therefore, the thickness T1 of the conductive layer 148 in the opening 144a and the thickness T2 of the conductive layer 148 in the opening 144b both are greater than the thickness T3 of the conductive layer 148 in the opening 144c, in accordance with some embodiments.

As shown in FIG. 1E, the mask layer 144 and the seed layer 142 thereunder are removed, in accordance with some embodiments. The seed layer 142 and the conductive layer 148 remaining over the conductive vias 130a together form conductive pillars 140a, in accordance with some embodiments. The seed layer 142 and the conductive layer 148 remaining over the conductive vias 130b together form conductive pillars 140b, in accordance with some embodiments.

The seed layer 142 and the conductive layer 148 remaining over the conductive vias 130c together form dummy conductive pillars 140c, in accordance with some embodiments. In some embodiments, each of the conductive pillar 140a or 140b or the dummy conductive pillar 140c includes an under bump metallization layer.

In some embodiments, each of the conductive pillar 140a or 140b or the dummy conductive pillar 140c includes an under bump metallization layer and a conductive bump over the under bump metallization layer. In some embodiments, the width W4 of the dummy conductive pillar 140c is substantially equal to or greater than the width W6 of the conductive pillar 140a. In some other embodiments, the width W4 is less than the width W6.

In some embodiments, a dummy conductive pillar 140c is between the conductive pillars 140a and 140b, and a distance D5 between the conductive pillar 140a and the dummy conductive pillar 140c is less than a distance D6 between the dummy conductive pillar 140c and the conductive pillar 140b. In some other embodiments, the distance D5 is substantially equal to or greater than the distance D6. The distance D5 ranges from about 25 µm to about 75 µm, in accordance with some embodiments. The distance D6 ranges from about 25 µm to about 75 µm, in accordance with some embodiments.

As shown in FIGS. 1D and 1E, since the thickness T1 and the thickness T2 both are greater than the thickness T3, the thickness T1' of the conductive pillar 140a and the thickness T2' of the conductive pillar 140b both are greater than the thickness T3' of the dummy conductive pillar 140c, in accordance with some embodiments. That is, top surfaces of the conductive pillars 140a and 140b are higher than a top surface of the dummy conductive pillar 140c, which helps the conductive pillars 140a and 140b bond with solder bumps in a subsequent bonding process and prevents the solder bumps from short-circuiting to adjacent dummy conductive pillars 140c, in accordance with some embodiments.

FIG. 1E-1 is a top view of a right region A of the redistribution structure 110 of FIG. 1E, in accordance with some embodiments. The region A of FIG. 1E shows a cross-sectional view illustrating the redistribution structure 110 along a sectional line A-A in FIG. 1E-1, in accordance with some embodiments.

As shown in FIGS. 1E and 1E-1, the width W6 of the conductive pillar 140a is less than the width W115a of the pad 115a, which reserves more space for layout, in accordance with some embodiments. In some other embodiments, the width W6 is greater than or equal to the width W115a, which improves the ability of the conductive pillar 140a to maintain balance in subsequent thermal processes. As shown in FIGS. 1E and 1E-1, the width W4 of the dummy conductive pillar 140c is substantially equal to the width W115c of the dummy pad 115c. In some other embodiments, the width W4 is greater than or less than the width W115c.

Figure 1F:
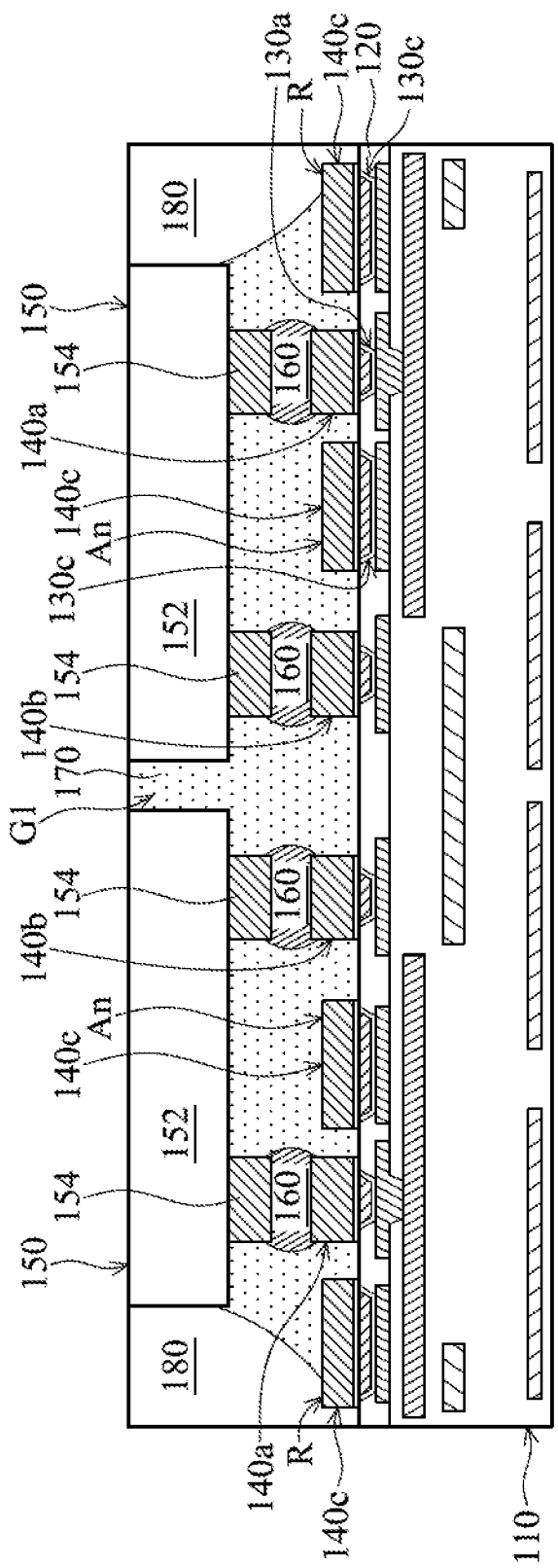
Figure 1G:
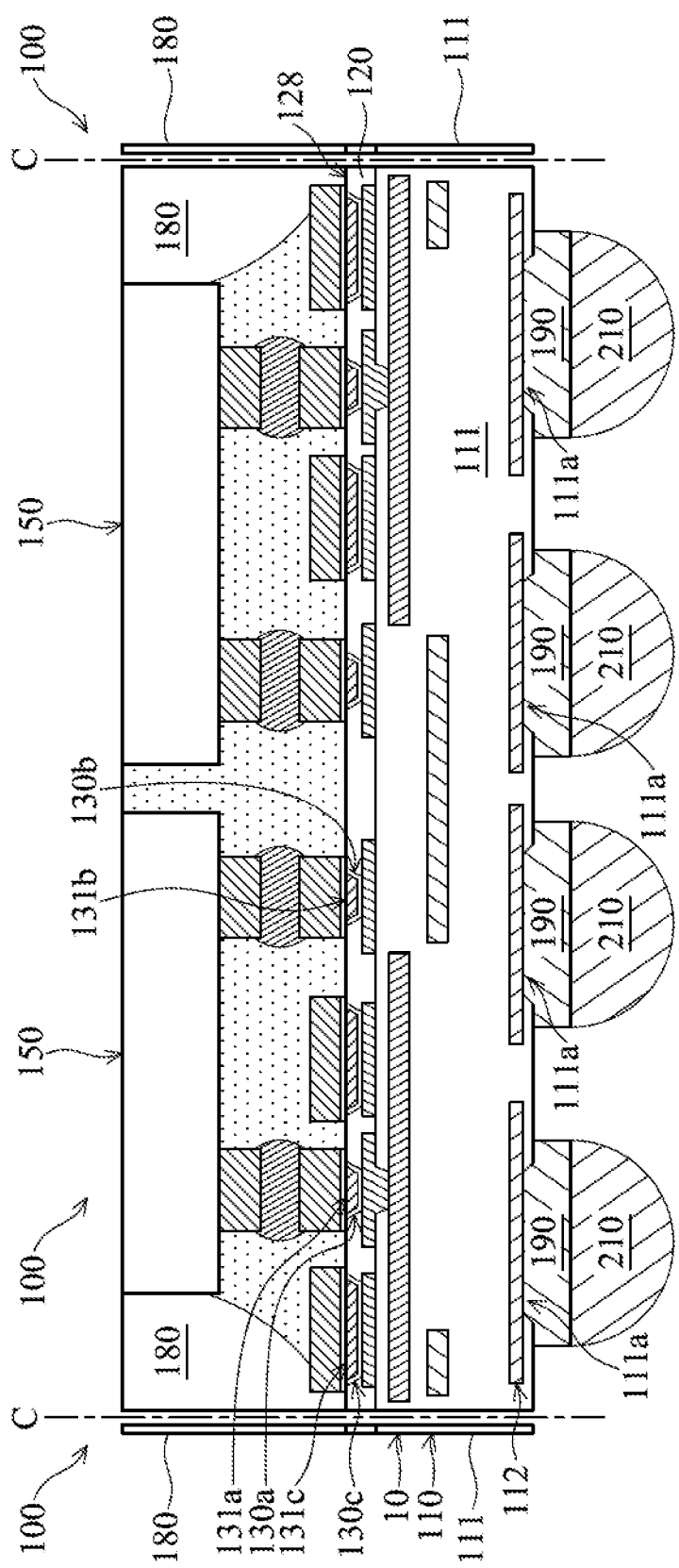
Figure 1H:
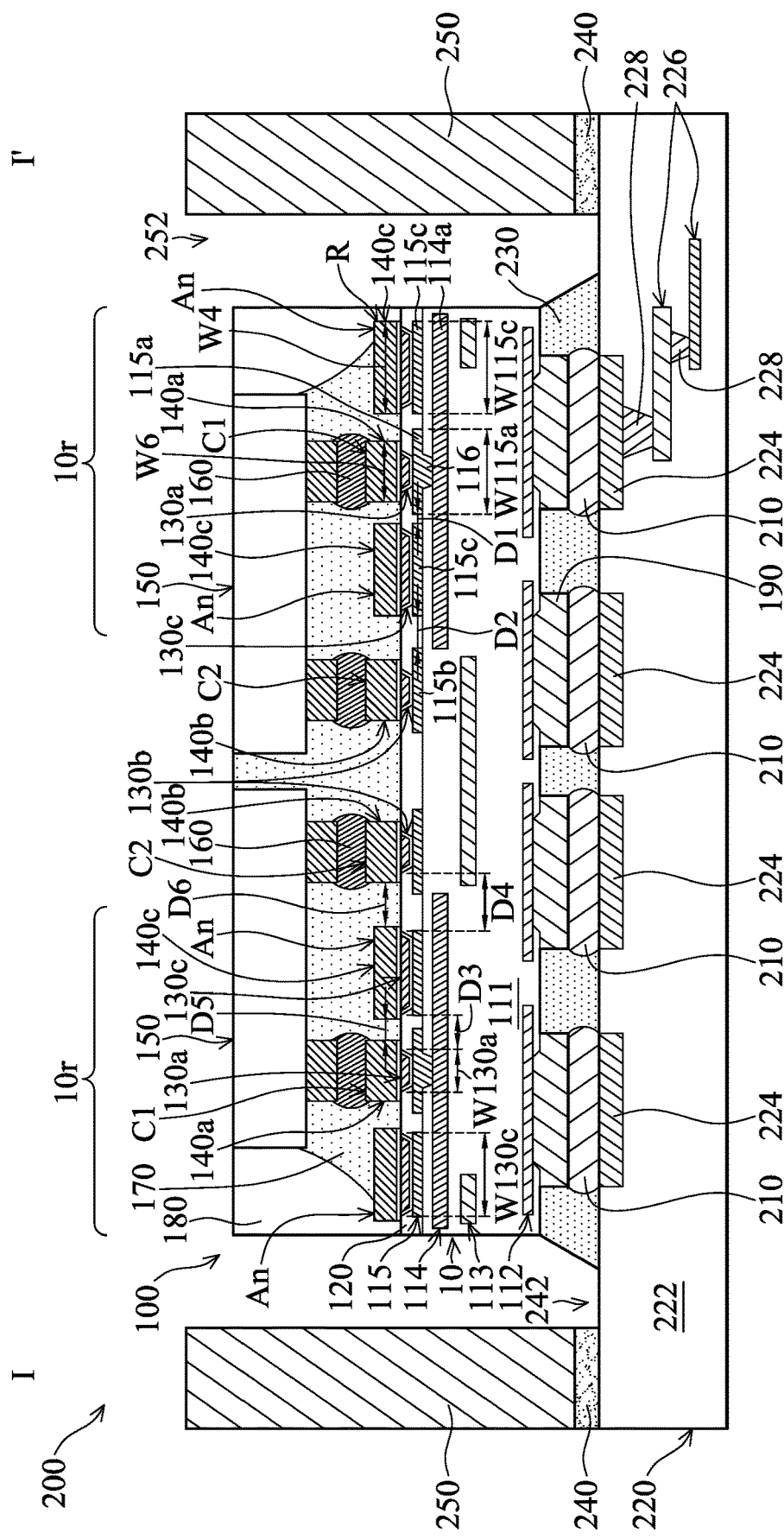
Figures 1, 1H:
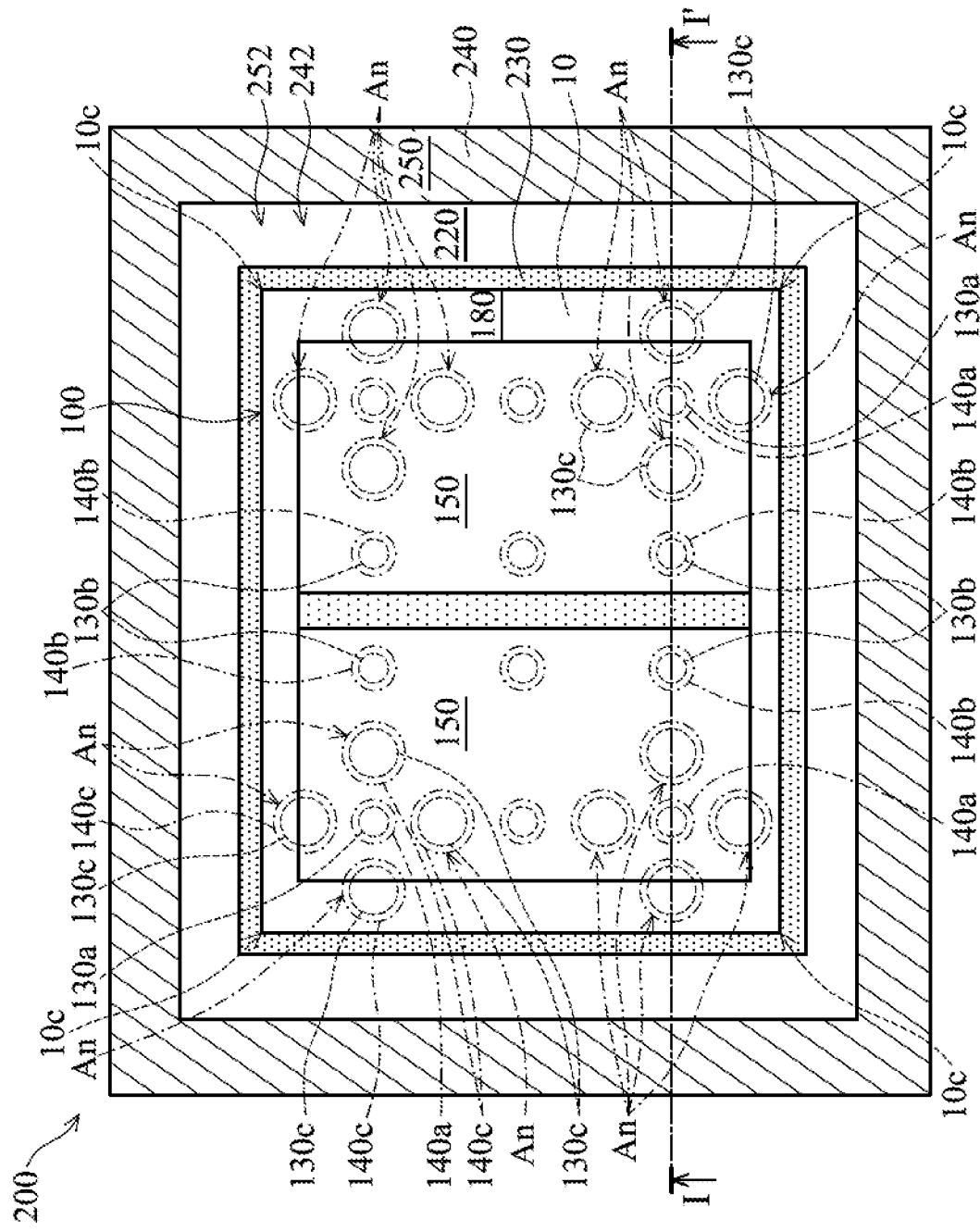
Figures 1, 1H, 2:
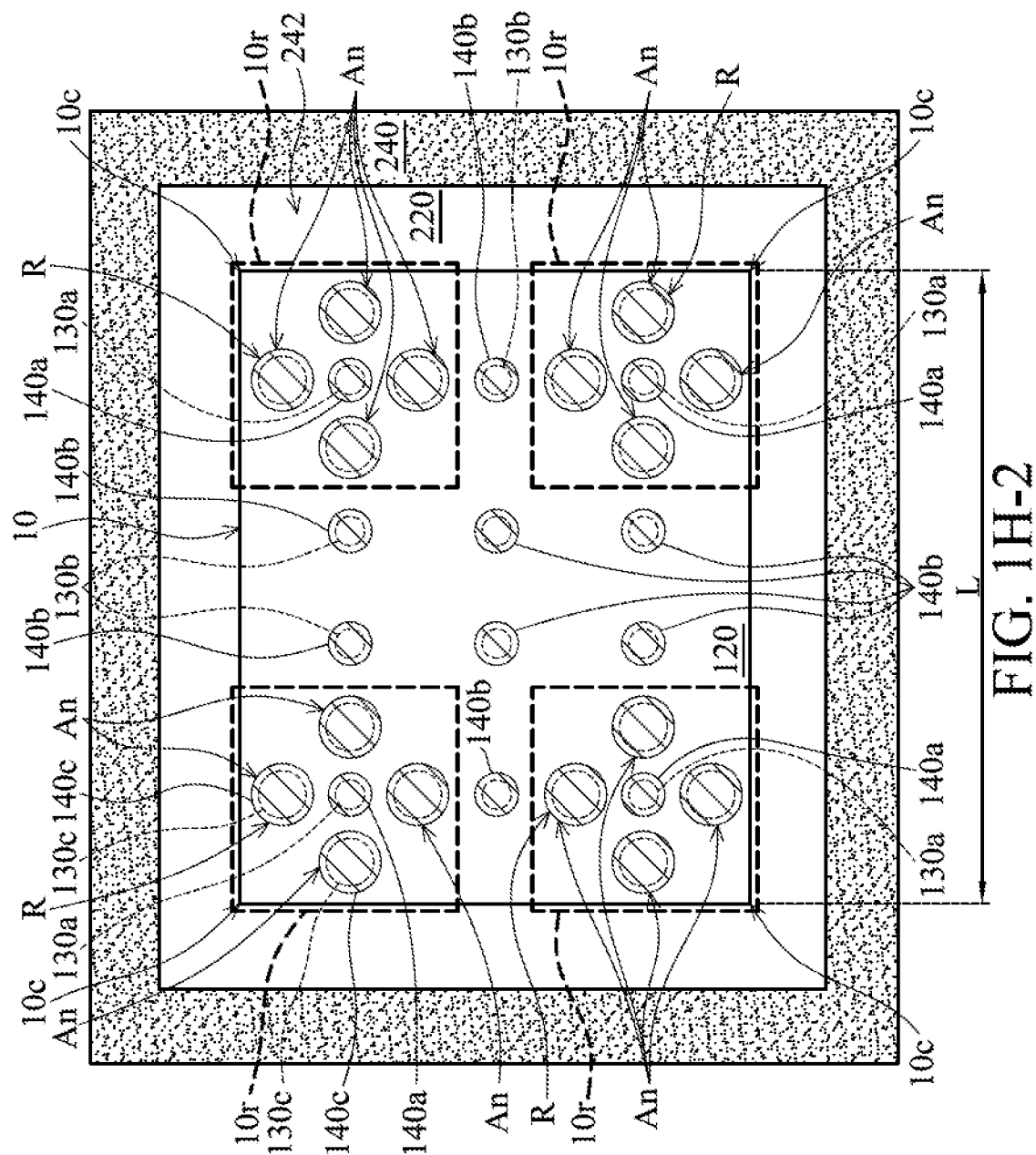

FIG. 1E-2 is a top view of a left region B of the redistribution structure 110 of FIG. 1E, in accordance with some embodiments. The region B of FIG. 1E shows a cross-sectional view illustrating the redistribution structure 110 along a sectional line B-B in FIG. 1E-2, in accordance with some embodiments. In some other embodiments, as shown in FIGS. 1E and 1E-2, the width W4 of the dummy conductive pillar 140c is greater than the width W115c' of the dummy pad 115c.

As shown in FIG. 1E, the dummy conductive pillar 140c, the dummy via 130c thereunder, and the dummy pad 115c thereunder together form an anchor structure An, in accordance with some embodiments. As shown in FIGS. 1E, 1E-1 and 1E-2, the anchor structures An surround the corresponding conductive pillar 140a, the corresponding conductive via 130a, and the corresponding pad 115a, in accordance with some embodiments. The anchor structures An together form an anchor ring-like structure R, in accordance with some embodiments.

The distances D5, D7, D8, and D9 between different dummy conductive pillars 140c and the corresponding conductive pillar 140a are substantially the same, in accordance with some embodiments. In some other embodiments, at least two of the distances D5, D7, D8, and D9 are different from each other.

As shown in FIG. 1F, chip structures 150 are bonded to the conductive pillars 140a through solder bumps 160, in accordance with some embodiments. Each chip structure 150 includes a chip 152 and conductive pillars 154 over the chip 152, in accordance with some embodiments. The chip structures 150 are electrically connected to the conductive vias 130a thereunder through the solder bumps 160 and the conductive pillars 140a, in accordance with some embodiments.

The chip structures 150 are electrically insulated from the dummy vias 130c and the dummy conductive pillars 140c, in accordance with some embodiments. In some embodiments, the dummy conductive pillar 140c between the conductive pillars 140a and 140b is also between the chip structure 150 and the dummy via 130c thereunder.

In some embodiments, the chip 152 includes a substrate, devices, and an interconnect structure over the substrate, in accordance with some embodiments. The substrate, the devices, and the interconnect layers are not shown in figures for the purpose of simplicity and clarity.

The substrate is made of an elementary semiconductor material including silicon or germanium in a single crystal structure, a polycrystal structure, or an amorphous structure. In some other embodiments, the substrate is made of a compound semiconductor, such as silicon carbide, gallium arsenide, gallium phosphide, indium phosphide, indium arsenide, an alloy semiconductor, such as SiGe, or GaAsP, or a combination thereof. The substrate may also include multi-layer semiconductors, semiconductor on insulator (SOI) (such as silicon on insulator or germanium on insulator), or a combination thereof.

In some embodiments, the devices of the chip 152 are formed in and/or over the substrate. Examples of the various devices include active devices, passive devices, other suitable elements, or a combination thereof. The active devices may include transistors or diodes formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate. The isolation features are used to define active regions and electrically isolate various devices formed in and/or over the substrate in the active regions. In some embodiments, the isolation features include shallow trench isolation (STI) features, local oxidation of silicon (LOCOS) features, other suitable isolation features, or a combination thereof. The conductive pillars 154 are made of a conductive material, such as metal (e.g., titanium, copper, nickel, aluminum, gold, silver, or tungsten) or alloys thereof, in accordance with some embodiments.

The interconnect structure is formed over the devices and the substrate, in accordance with some embodiments. The interconnect structure includes a dielectric layer, wiring layers, and conductive vias, in accordance with some embodiments. The wiring layers and the conductive vias are in the dielectric layer, in accordance with some embodiments.

The conductive vias are electrically connected between the wiring layers, the devices, and the conductive pillars 154, in accordance with some embodiments. Therefore, the conductive pillars 154 are electrically connected to the devices through the wiring layers and the conductive vias, in accordance with some embodiments.

The dielectric layer is made of an oxide-containing material (e.g., silicon oxide or tetraethyl orthosilicate (TEOS) oxide), an oxynitride-containing material (e.g., silicon oxynitride), a glass material (e.g., borosilicate glass (BSG), phosphoric silicate glass (PSG), borophosphosilicate glass (BPSG), or fluorinated silicate glass (FSG)), or a combination thereof, in accordance with some embodiments.

Alternatively, the dielectric layer includes a low-k material or a porous dielectric material having a k-value which is lower than that of silicon oxide, or lower than about 3.0 or about 2.5, in accordance with some embodiments. The wiring layers and the conductive vias are made of a conductive material, such as metal (e.g., copper, aluminum, gold, silver, or tungsten) or alloys thereof, in accordance with some embodiments. The solder bumps 160 are made of a conductive material, such as a tin-based alloy, in accordance with some embodiments.

As shown in FIG. 1F, an underfill layer 170 is formed between the chip structures 150 and the redistribution structure 110, in accordance with some embodiments. The underfill layer 170 surrounds the chip structures 150, the solder bumps 160, the conductive pillars 140a and 140b, and the dummy conductive pillars 140c, in accordance with some embodiments.

The underfill layer 170 extends into a gap G1 between the chips 152 of the chip structures 150, in accordance with some embodiments. The gap G1 is filled with the underfill layer 170, in accordance with some embodiments. The underfill layer 170 is made of an insulating material, such as a polymer material, in accordance with some embodiments.

As shown in FIG. 1F, the molding layer 180 is formed over the redistribution structure 110 and the underfill layer 170, in accordance with some embodiments. The molding layer 180 surrounds the chip structures 150 and the underfill layer 170, in accordance with some embodiments. The molding layer 180 is made of an insulating material, such as a polymer material (e.g., epoxy), in accordance with some embodiments.

As shown in FIG. 1G, portions of the dielectric layer 111 under the redistribution layer 112 are removed to form openings 111a in the dielectric layer 111, in accordance with some embodiments. The openings 111a expose portions of the redistribution layer 112, in accordance with some embodiments. The removal process includes an etching process, such as an anisotropic etching process (e.g., a dry etching process), in accordance with some embodiments.

As shown in FIG. 1G, conductive pillars 190 are formed over the portions of the redistribution layer 112 exposed by the openings 111a, in accordance with some embodiments. The conductive pillars 190 are electrically connected to the redistribution layer 112, in accordance with some embodiments.

The conductive pillars 190 are made of a conductive material, such as metal (e.g., copper, aluminum, gold, silver, tungsten, cobalt, nickel, or tin) or alloys thereof, in accordance with some embodiments. The conductive pillars 190 are formed using a plating process, such as an electroplating process, in accordance with some embodiments.

As shown in FIG. 1G, solder bumps 210 are formed over the conductive pillars 190, in accordance with some embodiments. The solder bumps 210 are made of a conductive material, such as a tin-based alloy, in accordance with some embodiments. The solder bumps 210 are made of a conductive material, such as a tin-based alloy, or another suitable conductive material with a melting point lower than that of the conductive pillars 190, in accordance with some embodiments. The solder bumps 210 are formed using a plating process, such as an electroplating process, and a reflow process, in accordance with some embodiments.

In this step, an interposer substrate 10 is substantially formed, in accordance with some embodiments. The interposer substrate 10 includes the redistribution structure 110, the dielectric layer 120, the conductive vias 130a and 130b, and the dummy vias 130c, in accordance with some embodiments.

As shown in FIG. 1G, a cutting process is performed to cut the interposer substrate 10 and the molding layer 180 along the cutting lines C to form chip package structures 100, in accordance with some embodiments. The process of FIGS. 1A-1G is a wafer level packaging process, in accordance with some embodiments. For the sake of simplicity, FIGS. 1A-1G only show the structure for forming one of the chip package structures 100, in accordance with some embodiments.

As shown in FIG. 1G, top surfaces 131a and 131b of the conductive vias 130a and 130b and top surfaces 131c of the dummy vias 130c are substantially coplanar, in accordance with some embodiments. The top surfaces 131a, 131b and 131c and a top surface 128 of the dielectric layer 120 are substantially coplanar, in accordance with some embodiments.

As shown in FIG. 1H, a wiring substrate 220 is provided, in accordance with some embodiments. The wiring substrate 220 includes a dielectric layer 222, bonding pads 224, wiring layers 226, and conductive vias 228, in accordance with some embodiments. The bonding pads 224 are formed over the dielectric layer 222, in accordance with some embodiments. The wiring layers 226 and the conductive vias 228 are formed in the dielectric layer 222, in accordance with some embodiments.

The conductive vias 228 are electrically connected between different wiring layers 226 and between the wiring layer 226 and the bonding pads 224, in accordance with some embodiments. For the sake of simplicity, FIG. 1H only shows two of the wiring layers 226, in accordance with some embodiments.

The dielectric layer 222 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The dielectric layer 222 is formed using deposition processes (e.g. chemical vapor deposition processes or physical vapor deposition processes), photolithography processes, and etching processes, in accordance with some embodiments.

The bonding pads 224 are made of a conductive material, such as metal (e.g. copper, aluminum, or tungsten) or alloys thereof, in accordance with some embodiments. The wiring layers 226 are made of a conductive material, such as metal (e.g. copper, aluminum, or tungsten) or alloys thereof, in accordance with some embodiments. The conductive vias 228 are made of a conductive material, such as metal (e.g. copper, aluminum, or tungsten) or alloys thereof, in accordance with some embodiments.

In some embodiments, the bonding pads 224, the wiring layers 226, and the conductive vias 228 are made of the same material. In some other embodiments. the bonding pads 224, the wiring layers 226, and the conductive vias 228 are made of different materials. In some embodiments, the wiring substrate 220 includes a multilayer core substrate.

As shown in FIG. 1H, the chip package structure 100 is bonded to the wiring substrate 220 through the solder bumps 210, in accordance with some embodiments. The solder bumps 210 are connected between the conductive pillars 190 and the bonding pads 224, in accordance with some embodiments.

The chip structures 150 are electrically connected to the wiring substrate 220 through the solder bumps 160, the conductive pillars 140a and 140b, the conductive vias 130a, 130b, and 116, the redistribution layers 112, 113, and 114, the pads 115a and 115b, and the conductive vias (not shown) between the redistribution layers 112, 113, and 114, in accordance with some embodiments.

The anchor structures An (each including the dummy conductive pillar 140c, the dummy via 130c thereunder, and the dummy pad 115c thereunder) are electrically insulated from the chip structures 150, the wiring substrate 220, the solder bumps 160, the conductive pillars 140a and 140b, the conductive vias 130a, 130b, and 116, the redistribution layers 112, 113, and 114, the pads 115a and 115b, and the conductive vias (not shown) between the redistribution layers 112, 113, and 114, in accordance with some embodiments.

As shown in FIG. 1H, an underfill layer 230 is formed between the chip package structure 100 and the wiring substrate 220, in accordance with some embodiments. The underfill layer 230 surrounds the solder bumps 210 and the conductive pillars 190, in accordance with some embodiments. The underfill layer 230 is made of an insulating material, such as a polymer material, in accordance with some embodiments.

FIG. 1H-1 is a top view of the chip package structure of FIG. 1H, in accordance with some embodiments. FIG. 1H is a cross-sectional view illustrating the chip package structure along a sectional line I-I' in FIG. 1H-1, in accordance with some embodiments.

As shown in FIGS. 1H and 1H-1, an adhesive layer 240 is formed over the wiring substrate 220, in accordance with some embodiments. The adhesive layer 240 has an opening 242, in accordance with some embodiments. The chip package structure 100 is in the opening 242, in accordance with some embodiments. The adhesive layer 240 has a ring shape, in accordance with some embodiments. The adhesive layer 240 is made of a polymer material such as epoxy or silicone, in accordance with some embodiments.

As shown in FIGS. 1H and 1H-1, a ring structure 250 is disposed over the adhesive layer 240, in accordance with some embodiments. In this step, a chip package structure 200 is substantially formed, in accordance with some embodiments. The ring structure 250 has an opening 252 over the opening 242, in accordance with some embodiments.

The chip package structure 100 is in the opening 252, in accordance with some embodiments. In some embodiments, the ring structure 250 and the adhesive layer 240 have substantially the same shape and substantially the same size. The ring structure 250 is made of a rigid material, such as metal (e.g., copper or iron), alloys thereof (e.g., stainless steel), or another suitable material which is more rigid than the wiring substrate 220, in accordance with some embodiments.

FIG. 1H-2 is a top view of the chip package structure of FIG. 1H, in accordance with some embodiments. For the sake of simplicity and clarity, FIG. 1H-2 does not show the ring structure 250, the chip structures 150, the underfill layers 170 and 230, and the molding layer 180, in accordance with some embodiments.

As shown in FIGS. 1H-1 and 1H-2, the conductive pillars 140a, the conductive vias 130a, and the anchor structures An (or the dummy vias 130c) are close to corners 10c of the interposer substrate 10, in accordance with some embodiments. As shown in FIG. 1H-2, the conductive pillars 140a, the conductive vias 130a, and the anchor structures An are in corner regions 10r of the interposer substrate 10, in accordance with some embodiments.

As shown in FIG. 1H-2, the corner regions 10r have a square shape, in accordance with some embodiments. In some other embodiments, as shown in FIG. 1H-3, the corner regions 10r have a fan shape or a substantially quarter-round shape. The area of each corner region 10r ranges from about 700 μm$^2$ to about 1300 μm$^2$, in accordance with some embodiments.

The conductive pillars 140a and the conductive vias 130a are also referred to as corner conductive pillars and corner conductive vias, in accordance with some embodiments. In some embodiments, as shown in FIG. 1H-2, the length L of the interposer substrate 10 is greater than about 26 mm, and the interposer substrate 10 is also referred to as a super large interposer substrate, in accordance with some embodiments.

The thermal expansion coefficient of the chip structures 150 is different from (e.g., less than) that of the wiring substrate 220, in accordance with some embodiments. The mismatch of thermal expansion coefficients between the chip structures 150 and the wiring substrate 220 may induce a thermal stress in the interposer substrate 10, especially in the corner regions 10r of the interposer substrate 10, in subsequent thermal processes, in accordance with some embodiments. The thermal stress tends to result in cracks in the conductive vias 130a, the pads 115a, the conductive vias 116, and the conductive lines 114a, in accordance with some embodiments.

The anchor structures An are made of metal or alloys thereof, the dielectric layers 111 and 120 are made of a polymer material or oxide, and therefore the anchor structures An are more rigid than the dielectric layers 111 and 120, in accordance with some embodiments.

Since the anchor structures An are more rigid than the dielectric layers 111 and 120, the anchor structures An may constrain portions of the interposer substrate 10, which is close to the anchor structures An, to reduce the stress and the strain in the interposer substrate 10 in the corner regions 10r in subsequent thermal processes. Therefore, in subsequent thermal processes, the thermal stress in the conductive vias 130a, the pads 115a, the conductive vias 116, and the conductive lines 114a in the corner regions 10r is reduced, in accordance with some embodiments. As a result, the anchor structures An improve the reliability of the chip package structure 200, in accordance with some embodiments. The formation process of the anchor structures An is compatible with the formation process of the conductive vias 130a and the pads 115a, and therefore no additional manufacturing cost is needed and no additional process time is required, in accordance with some embodiments.

In some embodiments, the conductive pillar 140a, the conductive via 130a thereunder, and the pad 115a thereunder together form a corner connector C1. In some embodiments, the conductive pillar 140b, the conductive via 130b thereunder, and the pad 115b thereunder together form a connector C2.

In some embodiments, the anchor structure An (between the corner connector C1 and the connector C2) is closer to the corner connector C1 and farther from the connector C2, which reduces the dielectric layer 120 between the anchor structure An and the corner connector C1. Therefore, the anchor structure An may constrain the dielectric layer 120 between the anchor structure An and the corner connector C1 more efficiently to reduce more stress and strain in the dielectric layer 120 therebetween in subsequent thermal processes.

When the anchor structure An is closer to the corner connector C1 and farther from the connector C2, the distance D1 between the pad 115a and the dummy pad 115c is less than the distance D2 between the dummy pad 115c and the pad 115b, the distance D3 between the conductive via 130a and the dummy via 130c is less than the distance D4 between the conductive via 130b and the dummy via 130c, and the distance D5 between the conductive pillar 140a and the dummy conductive pillar 140c is less than the distance D6 between the dummy conductive pillar 140c and the conductive pillar 140b, in accordance with some embodiments.

In some other embodiments, the anchor structure An is closer to the connector C2 and farther from the corner connector C1, which reduces the dielectric layer 120 between the anchor structure An and the connector C2. Therefore, the anchor structure An may constrain the dielectric layer 120 between the anchor structure An and the connector C2 more efficiently to reduce more stress and strain in the dielectric layer 120 therebetween in subsequent thermal processes. As a result, the anchor structure An may protect the connector C2 from damage in subsequent thermal processes.

When the anchor structure An is closer to the connector C2 and farther from the corner connector C1, the distance D1 between the pad 115a and the dummy pad 115c is greater than the distance D2 between the dummy pad 115c and the pad 115b, the distance D3 between the conductive via 130a and the dummy via 130c is greater than the distance D4 between the conductive via 130b and the dummy via 130c, and the distance D5 between the conductive pillar 140a and the dummy conductive pillar 140c is greater than the distance D6 between the dummy conductive pillar 140c and the conductive pillar 140b, in accordance with some embodiments.

In still other embodiments, the anchor structure An is positioned at the middle between the connector C2 and the corner connector C1, and therefore the anchor structure An equally constrains the dielectric layer 120 between the anchor structure An and the connector C2 and between the anchor structure An and the corner connector C1 to reduce stress and strain in the dielectric layer 120 therebetween in subsequent thermal processes. As a result, the anchor structure An may protect both the corner connector C1 and the connector C2 from damage in subsequent thermal processes.

When the anchor structure An is positioned at the middle between the connector C2 and the corner connector C1, the distance D1 between the pad 115a and the dummy pad 115c is equal to the distance D2 between the dummy pad 115c and the pad 115b, the distance D3 between the conductive via 130a and the dummy via 130c is equal to the distance D4 between the conductive via 130b and the dummy via 130c, and the distance D5 between the conductive pillar 140a and the dummy conductive pillar 140c is equal to the distance D6 between the dummy conductive pillar 140c and the conductive pillar 140b, in accordance with some embodiments.

In some embodiments, the anchor structure An is wider than or equal to the corner connector C1, which improves the ability of the anchor structure An to maintain balance in subsequent thermal processes. Therefore, the anchor structure An may constrain the dielectric layer 120 between the anchor structure An and the corner connector C1 more efficiently to reduce more stress and strain in the dielectric layer 120 therebetween in subsequent thermal processes.

When the anchor structure An is wider than or equal to the corner connector C1, the width W115c of the dummy pad 115c is greater than or substantially equal to the width W115a of the pad 115a, the width W130c of the dummy via 130c is greater than or substantially equal to the width W130a of the conductive via 130a, and the width W4 of the dummy conductive pillar 140c is greater than or substantially equal to the width W6 of the conductive pillar 140a, in accordance with some embodiments.

In some embodiments, the anchor structure An is narrower than the corner connector C1, which reserves more space for circuit layout. When the anchor structure An is narrower than the corner connector C1, the width W115c of the dummy pad 115c is less than the width W115a of the pad 115a, the width W130c of the dummy via 130c is less than the width W130a of the conductive via 130a, and the width W4 of the dummy conductive pillar 140c is less than the width W6 of the conductive pillar 140a, in accordance with some embodiments.

FIGS. 1H, 1H-1 and 1H-2 show the anchor structures An are in the corner regions 10r, though the present invention is not limited thereto. For example, the anchor structures An may surround the conductive vias 130b and the conductive pillars 140b according to requirements.

Although FIG. 1H-2 shows four anchor structures An surround one conductive via 130a, the present invention is not limited thereto. The number of the anchor structures An surrounding one conductive via 130a may be varied. In some embodiments, as shown in FIG. 2, the number of the anchor structures An surrounding one conductive via 130a is two. The two anchor structures An are on opposite sides of the conductive via 130a, in accordance with some embodiments.

Figures 1, 1H, 2, 3:
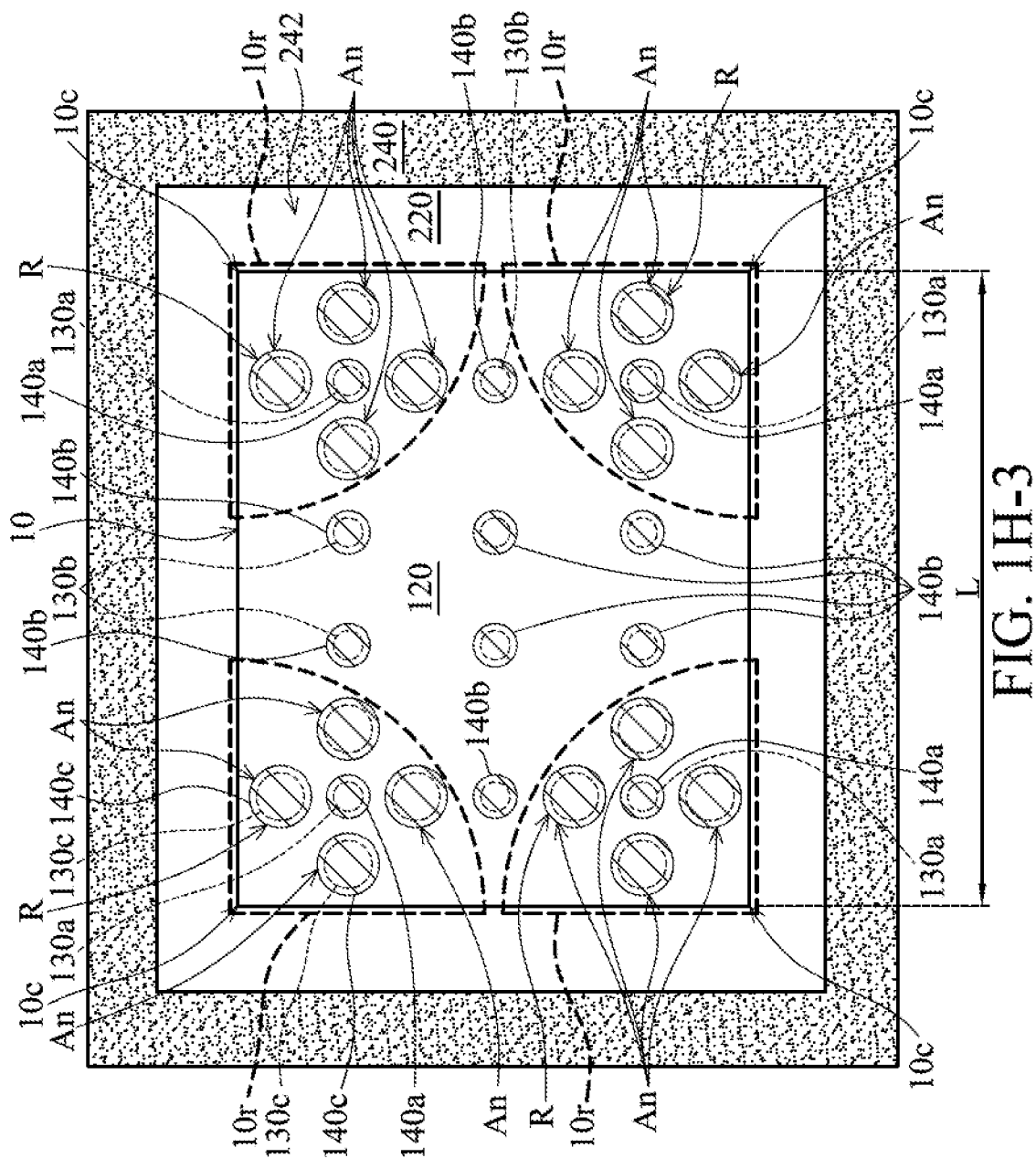

In some embodiments, as shown in FIG. 3, the number of the anchor structures An surrounding one conductive via 130a is three. The three anchor structures An are arranged at vertices of a triangle, in accordance with some embodiments. The conductive via 130a is arranged at a center of the triangle, in accordance with some embodiments.

In some embodiments, as shown in FIG. 4, the number of the anchor structures An surrounding one conductive via 130a is five. The five anchor structures An are arranged at vertices of a pentagon, in accordance with some embodiments. The conductive via 130a is arranged at a center of the pentagon, in accordance with some embodiments.

In some embodiments, as shown in FIG. 5, the number of the anchor structures An surrounding one conductive via 130a is six. The six anchor structures An are arranged at vertices of a hexagon, in accordance with some embodiments. The conductive via 130a is arranged at a center of the hexagon, in accordance with some embodiments.

Figure 6:
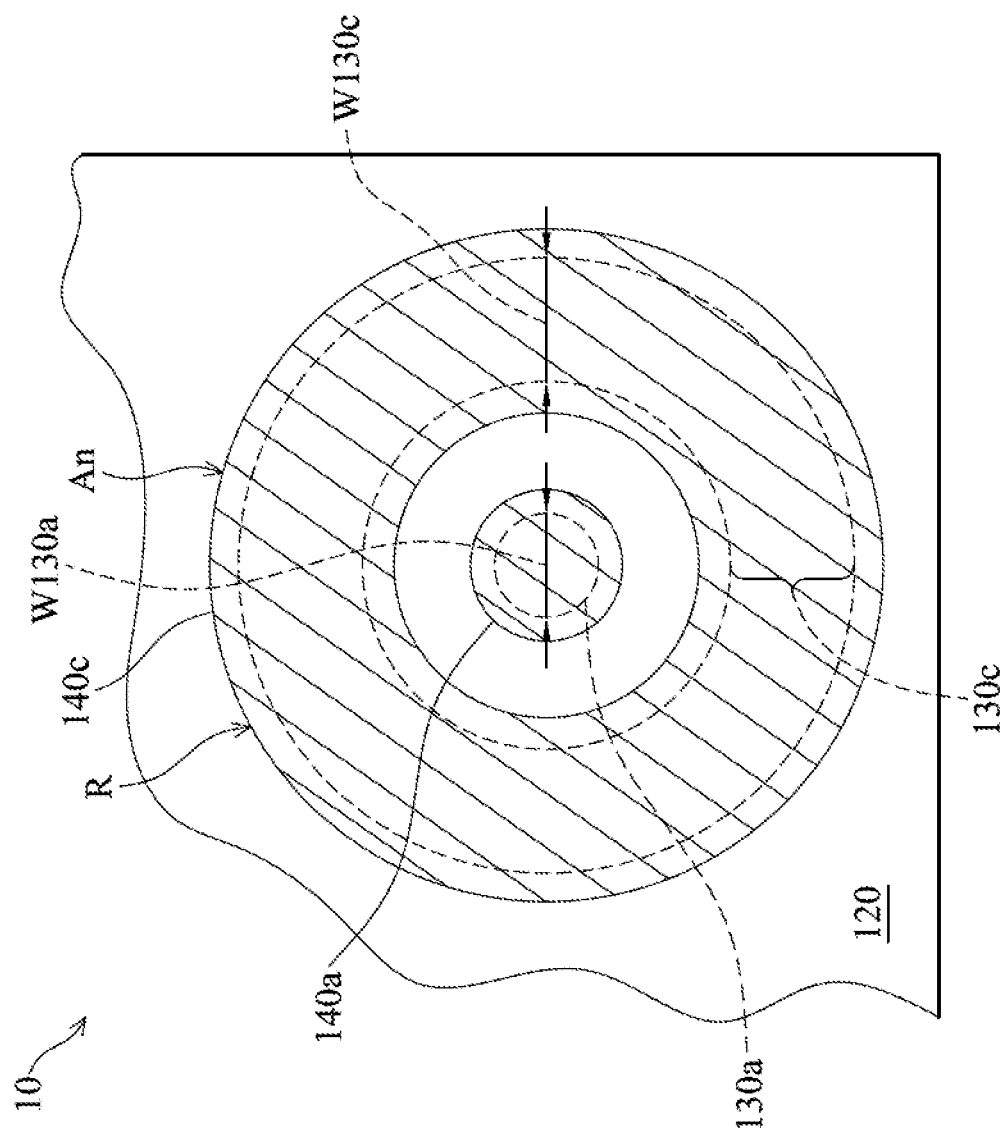
FIG. 6 is a top view of a corner region of the interposer substrate of FIG. 1H, in accordance with some embodiments.

In some embodiments, as shown in FIG. 6, only one anchor structure An continuously surrounds one conductive via 130a. The anchor structure An forms the anchor ring-like structure R, in accordance with some embodiments. The anchor structure An has a ring shape, in accordance with some embodiments. That is, the dummy via 130c and the dummy conductive pillar 140c have a ring shape, in accordance with some embodiments.

The anchor structure An continuously surrounds the entire conductive via 130a and the conductive pillar 140a, in accordance with some embodiments. In some embodiments, a width W130c of the dummy via 130c is substantially equal to or greater than a width W130a of the conductive via 130a. In some other embodiments, the width W130c is less than the width W130a.

Figure 7:
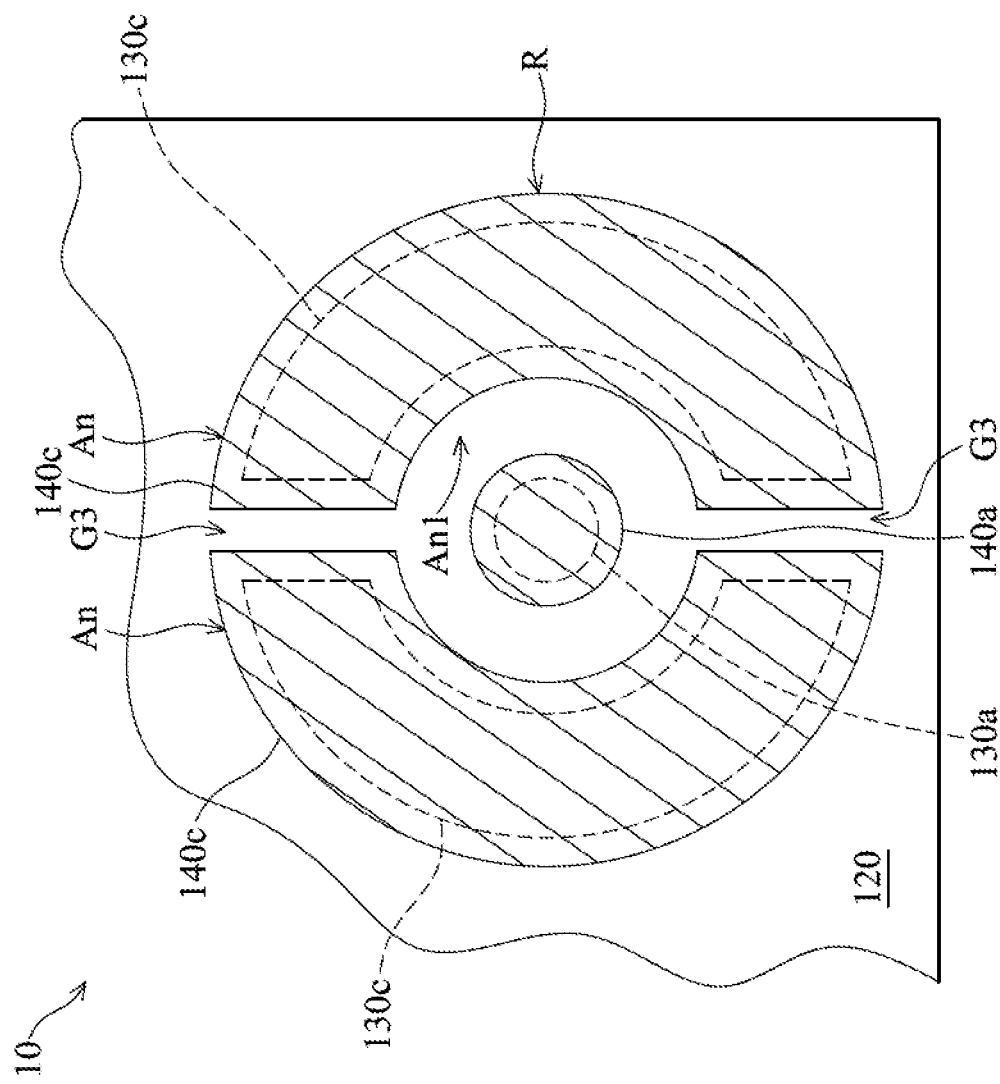
FIG. 7 is a top view of a corner region of the interposer substrate of FIG. 1H, in accordance with some embodiments.

In some embodiments, as shown in FIG. 7, the number of the anchor structures An surrounding one conductive via 130a is two. The two anchor structures An are spaced apart from each other by gaps G3, in accordance with some embodiments. The two anchor structures An together form the anchor ring-like structure R, in accordance with some embodiments. Each anchor structure An has a recess An1, in accordance with some embodiments. The conductive via 130a is partially in the recess An1, in accordance with some embodiments.

Figure 8:
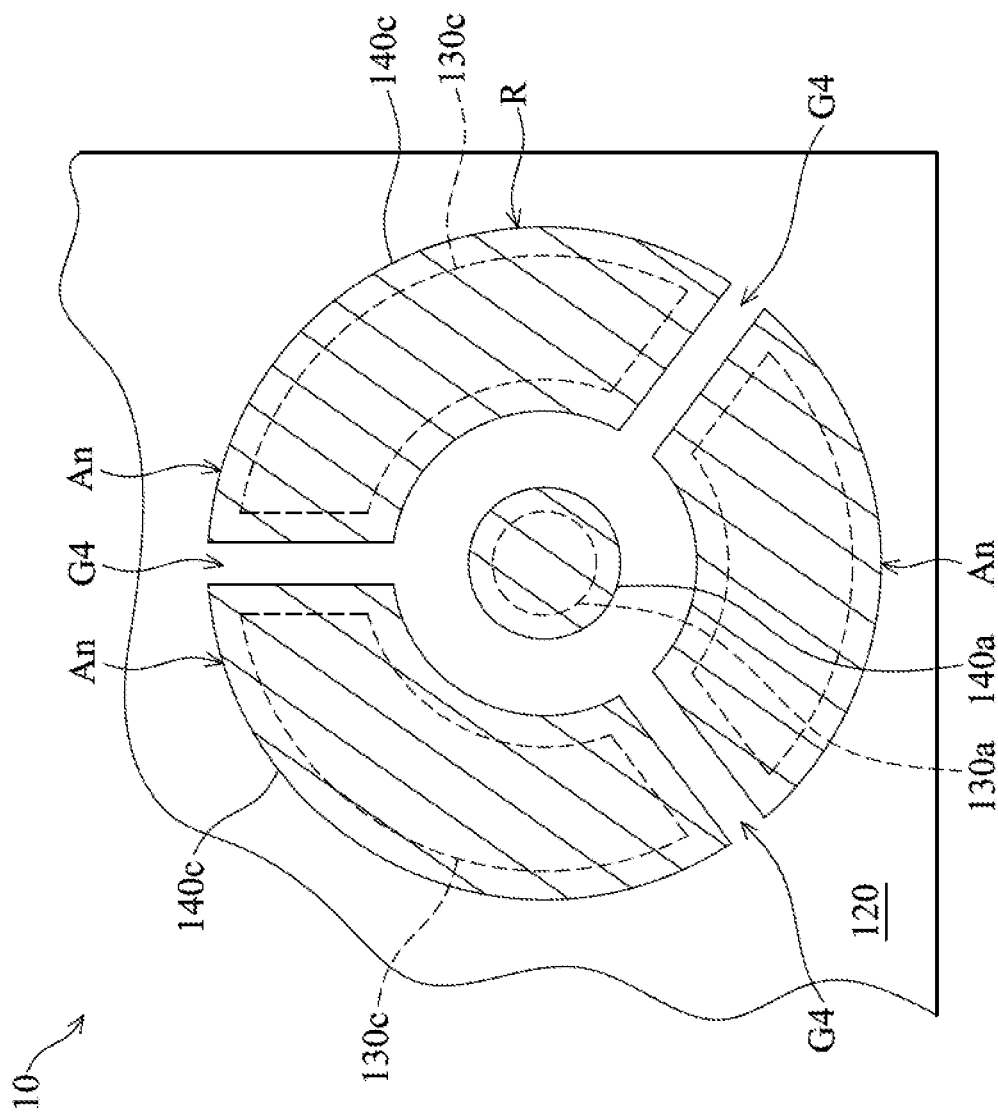
FIG. 8 is a top view of a corner region of the interposer substrate of FIG. 1H, in accordance with some embodiments.

In some embodiments, as shown in FIG. 8, the number of the anchor structures An surrounding one conductive via 130a is three. The three anchor structures An are spaced apart from each other by gaps G4, in accordance with some embodiments. The three anchor structures An together form the anchor ring-like structure R, in accordance with some embodiments.

Figure 9:
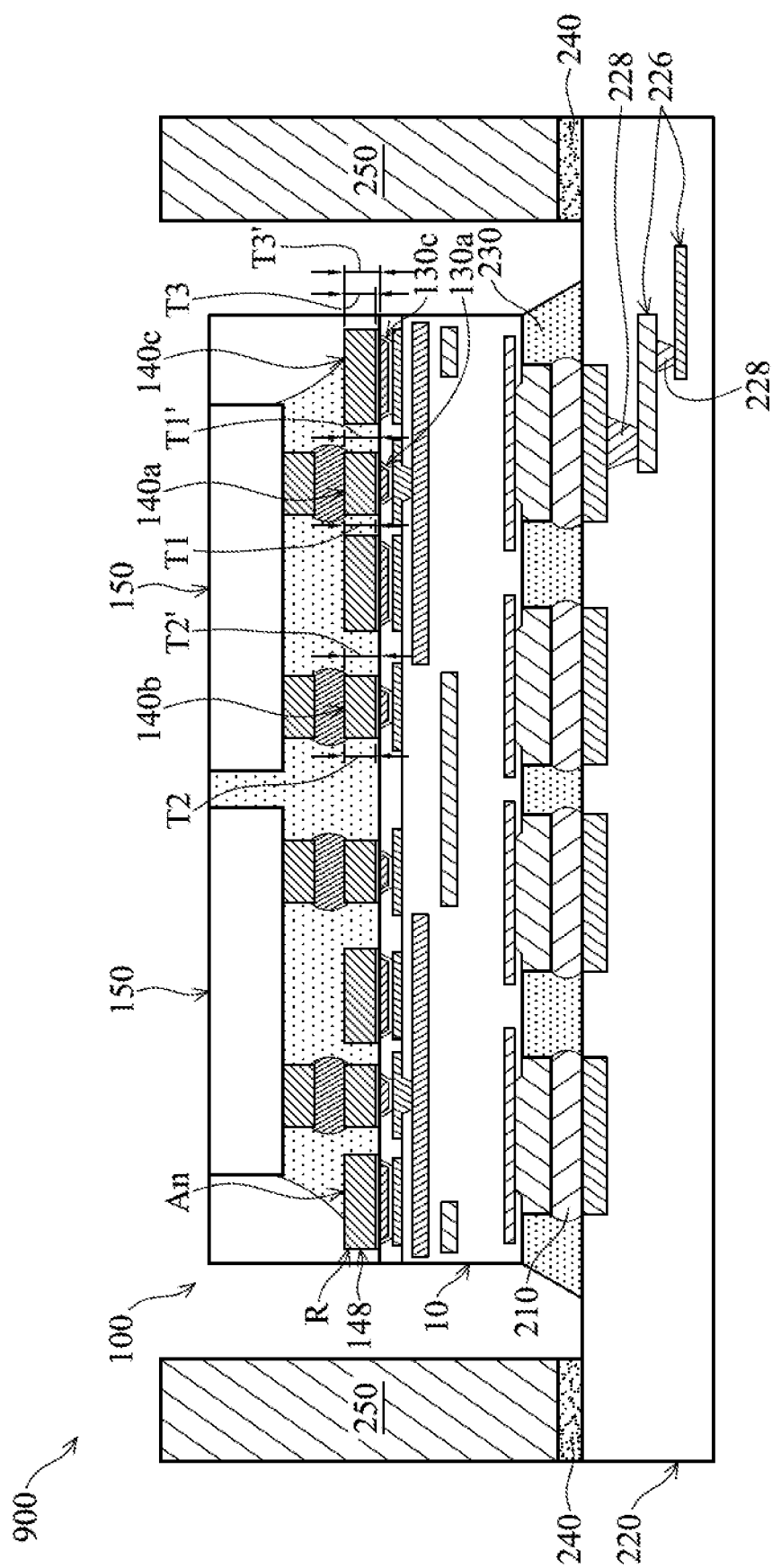
FIG. 9 is a cross-sectional view illustrating a chip package structure, in accordance with some embodiments.

FIG. 9 is a cross-sectional view illustrating a chip package structure 900, in accordance with some embodiments. As shown in FIG. 9, the chip package structure 900 is similar to the chip package structure 200 of FIG. 1H, except that the thickness T1' of the conductive pillar 140a or the thickness T2' of the conductive pillar 140b is substantially equal to the thickness T3' of the dummy conductive pillar 140c, in accordance with some embodiments. That is, top surfaces of the conductive pillars 140a and 140b and the dummy conductive pillar 140c are substantially level with each other, in accordance with some embodiments.

In some other embodiments, the thickness T1' or T2' is less than the thickness T3', which reduces the distance between the chip structures 150 and the interposer substrate 10 to reduce the thickness of the chip package structure 100 so as to minimize the size of the chip package structure 900. The thicknesses T1', T2', and T3' are adjustable according to requirements, in accordance with some embodiments. The thicknesses T1', T2', and T3' may be adjusted by adjusting process parameters of the plating process for forming the conductive pillars 140a and the dummy conductive pillar 140c, in accordance with some embodiments.

The thickness T1 of the conductive layer 148 of the conductive pillar 140a is equal to or less than the thickness T3 of the conductive layer 148 of the dummy conductive pillar 140c, in accordance with some embodiments. The thickness T2 of the conductive layer 148 of the conductive pillar 140b is equal to or less than the thickness T3, in accordance with some embodiments.

Figure 10A:
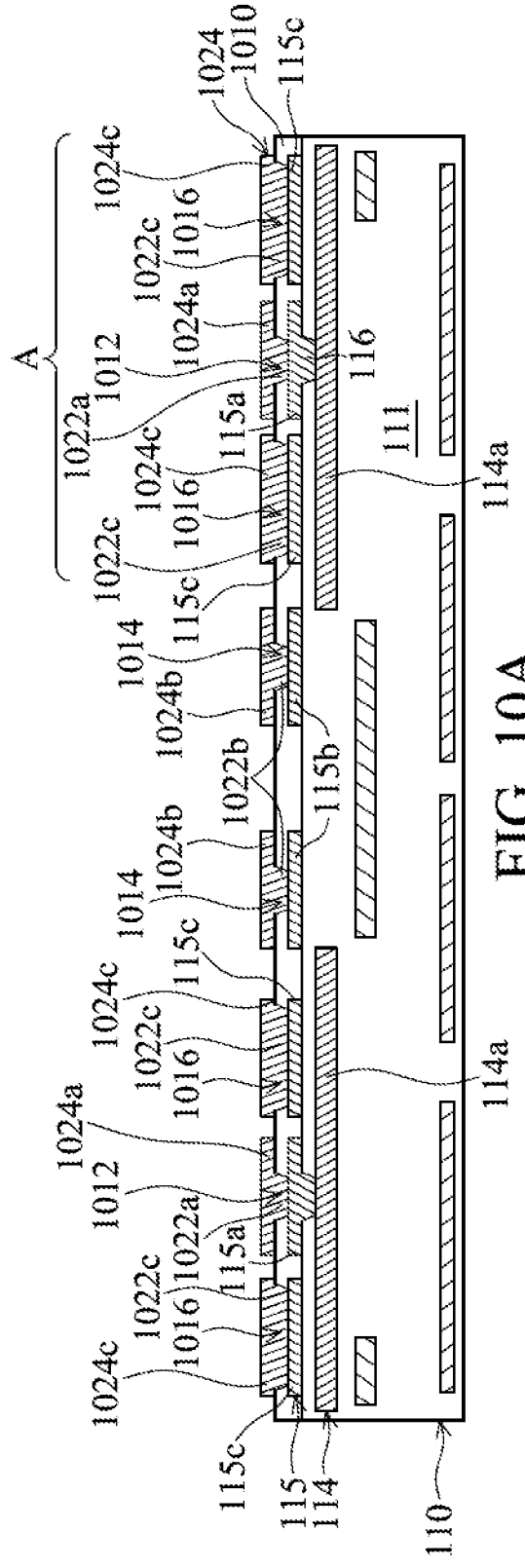
FIGS. 10A-10B are cross-sectional views of various stages of a process for forming a chip package structure, in accordance with some embodiments.
Figures 1, 10A:
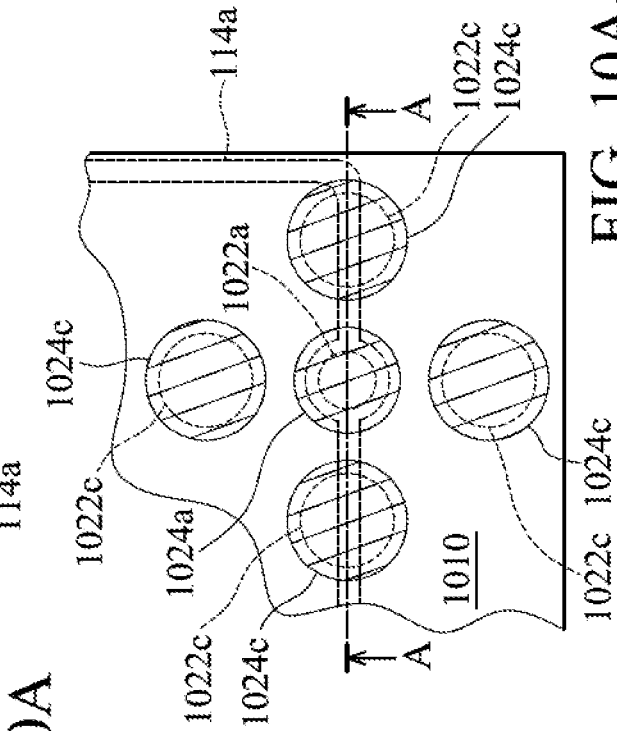
Figure 10B:
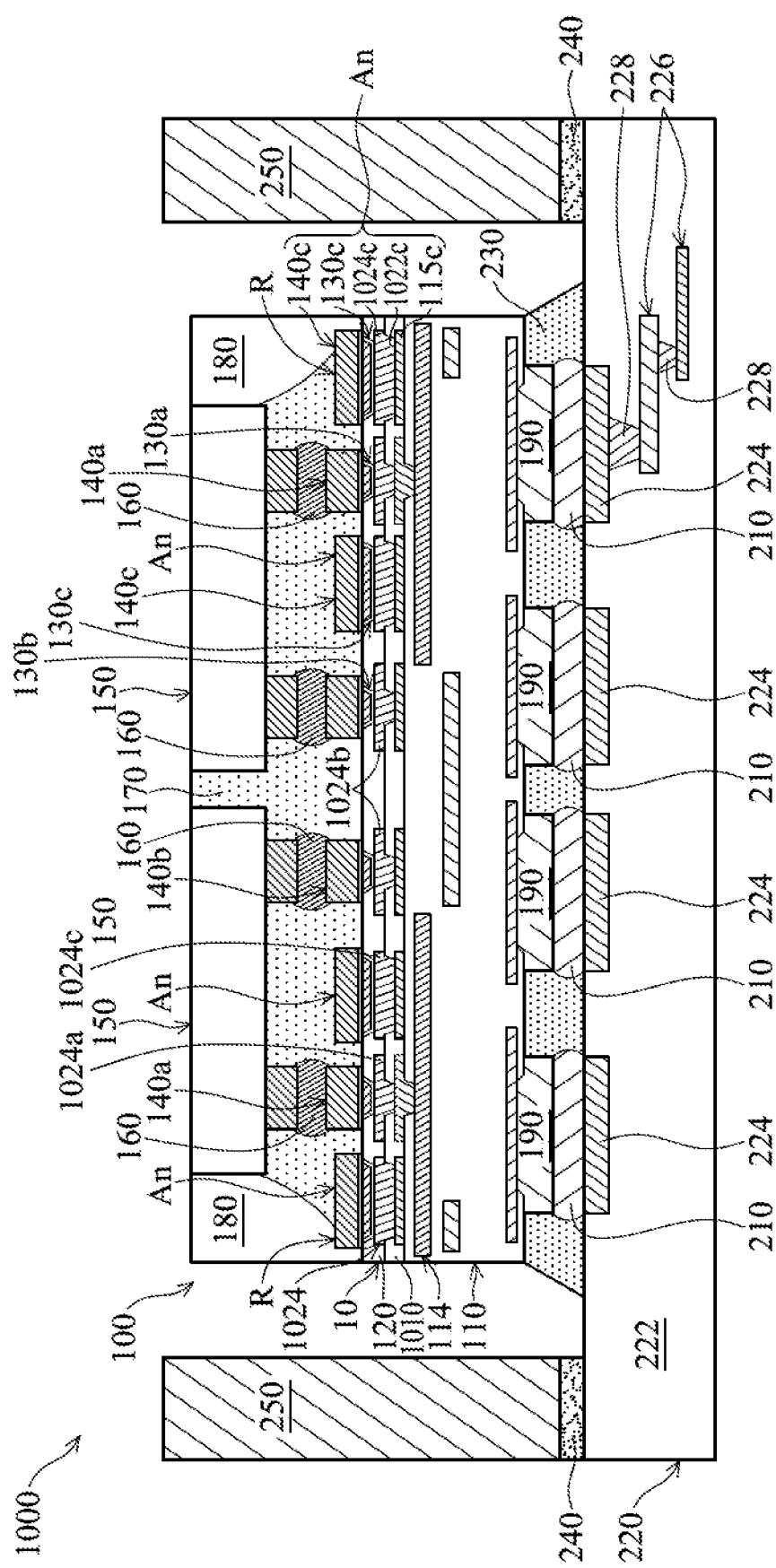

FIGS. 10A-10B are cross-sectional views of various stages of a process for forming a chip package structure, in accordance with some embodiments. As shown in FIG. 10A, after the step of FIG. 1A, a dielectric layer 1010 is formed over the redistribution structure 110, in accordance with some embodiments.

The dielectric layer 1010 has openings 1012, 1014, and 1016, in accordance with some embodiments. The openings 1012 expose the pads 115a thereunder, in accordance with some embodiments. The openings 1014 expose the pads 115b thereunder, in accordance with some embodiments. The openings 1016 expose the pads 115c thereunder, in accordance with some embodiments.

The dielectric layer 1010 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The dielectric layer 1010 is formed using deposition processes (e.g. chemical vapor deposition processes or physical vapor deposition processes), photolithography processes, and etching processes, in accordance with some embodiments.

FIG. 10A-1 is a top view of a corner region of the interposer substrate of FIG. 10A, in accordance with some embodiments. As shown in FIGS. 10A and 10A-1, conductive vias 1022a and 1022b and dummy vias 1022c are respectively formed in the openings 1012, 1014 and 1016, and a redistribution layer 1024 is formed over the dielectric layer 1010 and the conductive vias 1022a and 1022b and the dummy vias 1022c, in accordance with some embodiments.

The redistribution layer 1024 includes pads 1024a and 1024b and dummy pads 1024c, in accordance with some embodiments. The pads 1024a and 1024b and dummy pads 1024c are respectively formed over the conductive vias 1022a and 1022b and the dummy vias 1022c, in accordance with some embodiments.

The conductive vias 1022a and 1022b and dummy vias 1022c and the redistribution layer 1024 are made of a conductive material, such as metal (e.g. copper, aluminum, or tungsten) or alloys thereof, in accordance with some embodiments. The conductive vias 1022a and 1022b and dummy vias 1022c and the redistribution layer 1024 are formed using a plating process, such as an electroplating process, in accordance with some embodiments.

As shown in FIG. 10B, the steps of FIGS. 1B-1H are performed to form the dielectric layer 120, the conductive vias 130a and 130b, the dummy vias 130c, the conductive pillars 140a and 140b, the dummy conductive pillars 140c, the chip structures 150, the solder bumps 160, the underfill layer 170, the molding layer 180, the conductive pillars 190, the solder bumps 210, the wiring substrate 220, the underfill layer 230, the adhesive layer 240, and the ring structure 250 of the chip package structure 200 of FIG. 1H, in accordance with some embodiments.

The dielectric layer 120 is formed over the dielectric layer 1010 and the redistribution layer 1024, in accordance with some embodiments. The conductive vias 130a and 130b and the dummy vias 130c are in the dielectric layer 120 and respectively over the pads 1024a and 1024b and the dummy pads 1024c, in accordance with some embodiments.

The arrangements of the conductive pillars 140a and 140b, the dummy conductive pillars 140c, the chip structures 150, the solder bumps 160, the underfill layer 170, the molding layer 180, the conductive pillars 190, the solder bumps 210, the wiring substrate 220, the underfill layer 230, the adhesive layer 240, and the ring structure 250 are substantially the same or similar to that of the chip package structure 200 of FIG. 1H, in accordance with some embodiments. In this step, a chip package structure 1000 is substantially formed, in accordance with some embodiments.

Processes and materials for forming the chip package structures 900 and 1000 may be similar to, or the same as, those for forming the chip package structure 200 described above.

In accordance with some embodiments, chip package structures and methods for forming the same are provided. The methods (for forming the chip package structure) form anchor structures in a corner region of an interposer substrate which is between chip structures and a wiring substrate. The anchor structures are able to constrain the interposer substrate in the corner region so as to prevent conductive vias and conductive lines in the corner region from damage caused by a thermal stress in the interposer substrate, which is induced by the mismatch of thermal expansion coefficients between the chip structures and the wiring substrate. Therefore, the anchor structures improve the reliability of the chip package structure.

In accordance with some embodiments, a chip package structure is provided. The chip package structure includes a wiring substrate. The chip package structure includes an interposer substrate over the wiring substrate. The interposer substrate includes a redistribution structure, a dielectric layer, a conductive via, and a plurality of first dummy vias, the dielectric layer is over the redistribution structure, the conductive via and the first dummy vias pass through the dielectric layer, the first dummy vias surround the conductive via, and the first dummy vias are electrically insulated from the wiring substrate. The chip package structure includes a chip structure over the interposer substrate. The chip structure is electrically connected to the conductive via, and the chip structure is electrically insulated from the first dummy vias.

In accordance with some embodiments, a chip package structure is provided. The chip package structure includes an interposer substrate including a redistribution structure, a dielectric layer, and a conductive via. The dielectric layer is over the redistribution structure, and the conductive via is in the dielectric layer and electrically connected to the redistribution structure. The chip package structure includes an anchor ring-like structure partially embedded in the dielectric layer and surrounding the conductive via. The anchor ring-like structure is more rigid than the dielectric layer. The chip package structure includes a chip structure over the interposer substrate. The chip structure is electrically connected to the conductive via, and the chip structure is electrically insulated from the anchor ring-like structure.

In accordance with some embodiments, a method for forming a chip package structure is provided. The method includes forming a dielectric layer over a redistribution structure. The method includes forming a first conductive via and a plurality of dummy vias in the dielectric layer. The dummy vias surround the first conductive via. The method includes bonding a chip structure to the redistribution structure. The chip structure is electrically connected to the first conductive via, and the chip structure is electrically insulated from the dummy vias. The method includes bonding the redistribution structure to a wiring substrate. The dummy vias are electrically insulated from the wiring substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a chip package structure, comprising:
   forming a dielectric layer over a redistribution structure;
   forming a first conductive via and a plurality of dummy vias in the dielectric layer, wherein the dummy vias surround the first conductive via;
   forming a conductive pillar over the first conductive via;
   forming a plurality of dummy conductive pillars over the dummy vias;
   bonding a chip structure to the redistribution structure, wherein the chip structure is electrically connected to the first conductive via, the chip structure is electrically insulated from the dummy vias, the chip structure is bonded to the conductive pillar, and the chip structure is electrically insulated from the dummy conductive pillars; and
   bonding the redistribution structure to a wiring substrate, wherein the dummy vias are electrically insulated from the wiring substrate, and the redistribution structure is between the dielectric layer and the wiring substrate and between the chip structure and the wiring substrate.

2. The method for forming the chip package structure as claimed in claim 1, wherein the forming of the first conductive via and the dummy vias in the dielectric layer further comprises:
   forming a second conductive via in the dielectric layer, wherein one of the dummy vias is between the first conductive via and the second conductive via.

3. The method for forming the chip package structure as claimed in claim 2, wherein a first distance between the first conductive via and the one of the dummy vias is less than a second distance between the second conductive via and the one of the dummy vias.

4. The method for forming the chip package structure as claimed in claim 1, wherein a first width of one of the dummy vias is greater than a second width of the first conductive via.

5. The method for forming the chip package structure as claimed in claim 4, wherein the first width of the one of the dummy vias is greater than a distance between the first conductive via and the one of the dummy vias.

6. The method for forming the chip package structure as claimed in claim 1, wherein a first top surface of the first conductive via and second top surfaces of the dummy vias are substantially coplanar.

7. The method for forming the chip package structure as claimed in claim 6, wherein the first top surface, the second top surfaces, and a third top surface of the dielectric layer are substantially coplanar.

8. The method for forming the chip package structure as claimed in claim 1, wherein one of the dummy conductive pillars is wider than the conductive pillar.

9. The method for forming the chip package structure as claimed in claim 1, wherein one of the dummy conductive pillars is between the chip structure and one of the dummy vias.

10. The method for forming the chip package structure as claimed in claim 1, wherein the redistribution structure comprises:
    a conductive line partially under the first conductive via and at least one of the dummy vias; and
    a second conductive via connected between the first conductive via and the conductive line.

11. The method for forming the chip package structure as claimed in claim 1, wherein the conductive pillar is thicker than one of the dummy conductive pillars.

12. The method for forming the chip package structure as claimed in claim 1, wherein the dummy conductive pillars are between the chip structure and the redistribution structure.

13. The method for forming the chip package structure as claimed in claim 12, wherein a first top surface of the dummy conductive pillar is lower than a second top surface of the conductive pillar.

14. A method for forming a chip package structure, comprising:

forming a dielectric layer over a redistribution structure, wherein the redistribution structure comprises a redistribution layer, and the redistribution layer comprises a pad and a dummy pad, and the dummy pad is wider than the pad;

forming a conductive via and a first dummy via in the dielectric layer, wherein the first dummy via surrounds the conductive via, the conductive via is over and connected to the pad, and the first dummy via is over and connected to the dummy pad;

bonding a chip structure to the redistribution structure, wherein the chip structure is electrically connected to the conductive via, and the chip structure is electrically insulated from the first dummy via; and bonding the redistribution structure to a wiring substrate, wherein the first dummy via is electrically insulated from the wiring substrate.

15. The method for forming the chip package structure as claimed in claim 14, wherein the first dummy via has a ring shape.

16. The method for forming the chip package structure as claimed in claim 14, further comprising:

forming a second dummy via in the dielectric layer, wherein the second dummy via surrounds the conductive via, the first dummy via and the second dummy via are spaced apart from each other, and the first dummy via and the second dummy via together form a ring structure.

17. The method for forming the chip package structure as claimed in claim 14, wherein a first width of the first dummy via is substantially equal to or greater than a second width of the conductive via.

18. A method for forming a chip package structure, comprising:

forming a conductive pillar and dummy conductive pillars over a redistribution structure, wherein the dummy conductive pillars surround the conductive pillar, and the dummy conductive pillars are thinner and wider than the conductive pillar;

bonding a chip structure to the redistribution structure, wherein the chip structure is electrically connected to the conductive pillar, and the chip structure is electrically insulated from the dummy conductive pillars;

forming an underfill layer between the chip structure and the redistribution structure, wherein a portion of the underfill is between the chip structure and the dummy conductive pillars, and the portion of the underfill is in direct contact with top surfaces of the dummy conductive pillars; and bonding the redistribution structure to a wiring substrate, wherein the dummy conductive pillars are electrically insulated from the wiring substrate.

19. The method for forming the chip package structure as claimed in claim 18, wherein the conductive pillar and the dummy conductive pillars are under a corner portion of the chip structure.

20. The method for forming the chip package structure as claimed in claim 18, wherein the redistribution structure comprises a dielectric layer and a redistribution layer in the dielectric layer, and the dummy conductive pillars are more rigid than the dielectric layer.

* * * * *